United States Patent
Yokozeki

(10) Patent No.: US 7,002,834 B2
(45) Date of Patent: Feb. 21, 2006

(54) SEMICONDUCTOR INTEGRATED CIRCUIT

(75) Inventor: Wataru Yokozeki, Kunitachi (JP)

(73) Assignee: Fujitsu Limited, Kawasaki (JP)

(*) Notice: Subject to any disclaimer, the term of this patent is extended or adjusted under 35 U.S.C. 154(b) by 164 days.

(21) Appl. No.: 10/778,320

(22) Filed: Feb. 17, 2004

(65) Prior Publication Data

US 2004/0208046 A1 Oct. 21, 2004

(30) Foreign Application Priority Data

Feb. 17, 2003 (JP) ............... 2003-037894

(51) Int. Cl.
*G11C 11/22* (2006.01)

(52) U.S. Cl. .................. 365/145; 365/65; 365/157; 365/109

(58) Field of Classification Search ............. 365/145, 365/157, 65, 109, 154
See application file for complete search history.

(56) References Cited

U.S. PATENT DOCUMENTS

| | | | |
|---|---|---|---|
| 5,029,128 A * | 7/1991 | Toda .................. | 365/145 |
| 5,781,062 A * | 7/1998 | Mashiko et al. ....... | 327/544 |
| 6,337,824 B1 * | 1/2002 | Kono et al. ........... | 365/207 |
| 6,646,909 B1 * | 11/2003 | Miwa et al. .......... | 365/154 |

FOREIGN PATENT DOCUMENTS

| | | |
|---|---|---|
| JP | 05-210976 | 8/1993 |
| JP | 07-212217 | 8/1995 |

* cited by examiner

*Primary Examiner*—Anh Phung
*Assistant Examiner*—Eric J. Wendler
(74) *Attorney, Agent, or Firm*—Arent Fox PLLC

(57) ABSTRACT

At switching normal operation mode to low power mode, a first switch disconnects a virtual power supply line and a normal power supply line in response to activation of a switch control signal. The power supply voltage to a first circuit block connected to the virtual power supply line is suspended during the low power mode. A second switch of a floating prevention circuit connects a node between output of the first circuit block and input of a second circuit block to a first voltage line in response to inactivation of the switch control signal during the low power mode. This prevents the input of the second circuit block from floating even without the power supply voltage supplied to the first circuit block, and therefore prevents feedthrough current from flowing through the second circuit block, which enables reduction in power consumption during the low power mode.

17 Claims, 20 Drawing Sheets

SEMICONDUCTOR INTEGRATED CIRCUIT

CROSS REFERENCE TO RELATED APPLICATION

This application is based upon and claims the benefit of priority from Japanese Patent Application No. 2003-037894, filed on Feb. 17, 2003, the entire contents of which are incorporated herein by reference.

BACKGROUND OF THE INVENTION

1. Field of the Invention

The present invention relates to a semiconductor integrated circuit having a circuit block which is constituted of a transistor with a low threshold voltage, and to which the supply of a power supply voltage is suspended while it is in nonoperation.

2. Description of the Related Art

In accordance with the miniaturization of the semiconductor element structure, an insulation film constituting a transistor has become thinner, which often lowers reliability of the transistor. A power supply voltage supplied to a semiconductor integrated circuit has been decreasing year by year in order to prevent reliability deterioration.

When the power supply voltage is lowered and the difference between the power supply voltage and a threshold voltage of the transistor is thereby reduced, it is difficult for the transistor to turn on, resulting in a decrease in the operating speed. In order to prevent this, the threshold voltage of the transistor has been lowered in accordance with reduction in the power supply voltage.

Moreover, the miniaturization of a transistor has been accompanied by an increase in a leak current (subthreshold current) when the transistor is in nonoperation. The increase in the subthreshold current results in increase in power consumption during a standby period of a semiconductor integrated circuit. The increase in power consumption is a serious problem for portable equipment using battery.

Japanese Unexamined Patent Application Publication Nos. Hei 5-210976 and Hei 7-212217 disclose a technique called MTCMOS (Multi-Threshold voltage CMOS) for reducing the subthreshold current. In the MTCMOS technique, the threshold voltage of a transistor in a circuit block requiring a high-speed operation is set low, and a power supply terminal of the circuit block is connected to a power supply line via a switch transistor with a high threshold voltage. Then, keeping the switch transistor on while the circuit block is in operation and off while the circuit block is in nonoperation reduces the power consumption during a standby period.

SUMMARY OF THE INVENTION

It is an object of the present invention to reduce power consumption during a standby period of a semiconductor integrated circuit having a circuit block to which the MTCMOS technique is adopted.

According to one of the aspects of the semiconductor integrated circuit of the present invention, a switch control circuit maintains the activation of a switch control signal during a normal operation mode and the inactivation of the switch control signal during a low power mode. In response to the activation of the switch control signal, a first switch connects a virtual power supply line to a normal power supply line to which a power supply voltage is constantly supplied. The supply of the power supply voltage to the first circuit block whose power supply terminal is connected to the virtual power supply line is suspended during the low power mode. The second circuit block connected to the normal power supply line at its power supply terminal is constantly supplied with the power supply voltage, irrespective of the operation mode.

A floating prevention circuit is disposed between an output of the first circuit block and an input of the second circuit block. A second switch of the floating prevention circuit connects a connecting node between the output of the first circuit block and the input of the second circuit block to a first voltage line in response to the inactivation of the switch control signal during the low power mode. This prevents the input of the second circuit block from floating, even without the supply of the power supply voltage to the first circuit block. Consequently, a feedthrough current is prevented from flowing to the second circuit block. Moreover, the second circuit block is prevented from malfunctioning due to receipt of an unstable input level so that the increase in power consumption can be also prevented during the low power mode.

The second switch interrupts the connection between the connecting node and the first voltage line in response to the activation of the switch control signal during the normal operation mode. The connecting node is brought into the floating state, so that the output of the first circuit block is speedily and surely transmitted to the second circuit block.

According to another aspect of the semiconductor integrated circuit of the present invention, the second switch is a transistor connected to the first voltage line at its source, connected to the connecting node at its drain, and receiving the switch control signal at its gate. Therefore, with a simple switch, it is possible to prevent the input of the second circuit block from floating during the low power mode. As a result, the formation of the floating prevention circuit leads to almost no increase in circuit scale.

According to still another aspect of the semiconductor integrated circuit of the present invention, the first circuit block has a latch circuit and a pair of ferroelectric capacitors. The latch circuit has therein two buffer circuits with their inputs and outputs connected to each other and their power supply terminals connected to the virtual power supply line. The ferroelectric capacitors are connected to the inputs of the buffer circuits at one ends and are connected to a first plate line at the other ends.

A plate voltage generator generates a first plate voltage signal on the first plate line when the normal operation mode is switched to the low power mode. Due to the voltage change on the first plate line, data held in the latch circuit before the power-off is held as residual dielectric polarization of the ferroelectric capacitors. The residual dielectric polarization state remains even after the power supply is turned off. In other words the first circuit block operates as a nonvolatile latch circuit.

Thereafter, an output of the powered-off latch circuit is brought into the floating state. However, the input of the second circuit block is connected to the first voltage line by switching the normal operation mode to the low power mode, and is thereby prevented from going into the floating state. Thus, even in a semiconductor circuit having the second circuit block connected with the latch circuit with a power supply thereto being turned off during the low power mode, it is possible to prevent the feedthrough current from flowing through the second circuit block and the second circuit block from malfunctioning during the low power mode.

When the low power mode is switched to the normal operation mode, the plate voltage generator generates a first plate voltage signal on the first plate line. Due to the voltage change on the first plate line, voltages according to residual dielectric polarization values of the ferroelectric capacitors appear at the input and output of the latch circuit. The data held in the latch circuit before the power-off is re-held in the latch circuit. The latch circuit outputs the held data to the second circuit block.

According to yet another aspect of the semiconductor integrated circuit of the present invention, when the normal operation mode is switched to the low power mode, the plate voltage generator changes the first plate voltage signal from a low level to a high level for a predetermined period before the inactivation of the switch control signal. Consequently, the data held in the latch circuit is surely written as the residual dielectric polarization of the ferroelectric capacitors and remains held even after the power supply is turned off.

According to yet another aspect of the semiconductor integrated circuit of the present invention, when the low power mode is switched to the normal operation mode, the plate voltage generator changes the first plate voltage signal from a low level to a high level during a predetermined period. Due to the change of the first plate voltage signal to the high level, voltages according to the respective residual dielectric polarization values of the ferroelectric capacitors appear at the input and the output of the latch circuit. Thereafter, the switch control circuit activates the switch control signal during the high-level period of the first plate voltage signal. The activation of the switch control signal causes the latch circuit to be activated, so that the data held in the ferroelectric capacitors is rewritten to the latch circuit. That is, the data held in the latch circuit before the low power mode is restored.

According to yet another aspect of the semiconductor integrated circuit of the present invention, the floating prevention circuit has a clocked inverter which is disposed between the output of the first circuit block and the connecting node. The clocked inverter is on while the switch control signal is activated, thereby transmitting an output level of the first circuit block to the second circuit block. The clocked inverter is off while the switch control signal is inactivated, thereby prohibiting the transmission of the output level of the first circuit block to the second circuit block. That is, the output of the first circuit block and the connecting node are electrically disconnected during the low power mode. Consequently, a voltage of the first voltage line supplied to the connecting node during the low power mode is not transmitted to the latch circuit of the first circuit block. Therefore, when the low power mode is switched to the normal operation mode, an output node of the latch circuit can be brought into a complete floating state. As a result, the data written to the ferroelectric capacitors can be surely returned to the latch circuit.

According to yet another aspect of the semiconductor integrated circuit of the present invention, the floating prevention circuit has a CMOS switch which is connected to the output of the first circuit block at one end and to the connecting node at the other end. The CMOS switch is on while the switch control signal is activated, thereby transmitting an output level of the first circuit block to the second circuit block. The CMOS switch is off while the switch control signal is inactivated, thereby prohibiting the transmission of an output level of the first circuit block to the second circuit block. This means that the output of the first circuit block and the connecting node are electrically disconnected during the low power mode. Consequently, when the low power mode is switched to the normal operation mode, an output node of the latch circuit of the first circuit block can be brought into a complete floating state. As a result, the data written to the ferroelectric capacitors can be surely returned to the latch circuit.

According to yet another aspect of the semiconductor integrated circuit of the present invention, in response to the inactivation of the switch control signal, a third switch connects the inputs of the buffer circuits to the first voltage line. Forcibly connecting the ferroelectric capacitors to the first voltage line at one ends at the start of the low power mode can prevent the residual dielectric polarization values of the ferroelectric capacitors from varying due to noises.

According to yet another aspect of the semiconductor integrated circuit of the present invention, the first circuit block has a latch circuit, a pair of first ferroelectric capacitors, and a pair of second ferroelectric capacitors. The latch circuit has therein two buffer circuits with their inputs and outputs connected to each other and their power supply terminals connected to the virtual power supply line. The first ferroelectric capacitors are connected in series between a first plate line and a second plate line, and connected to the input of one of the buffer circuits at a connecting node of the first ferroelectric capacitors. The second ferroelectric capacitors are connected in series between the first plate line and the second plate line, and connected to the input of the other buffer circuit at a connecting node of the second ferroelectric capacitors.

When the normal operation mode is switched to the low power mode, a plate voltage generator generates first and second plate voltage signals on the first and the second plate line respectively. Due to the change in voltage in the first and the second plate lines, data held in the latch circuit before the power-off is held as residual dielectric polarization of the pair of first ferroelectric capacitors and of the pair of second ferroelectric capacitors. The residual dielectric polarization state is maintained even after the power supply is turned off. This means that the first circuit block operates as a nonvolatile latch circuit.

Thereafter, an output of the powered-off latch circuit is brought into a floating state. However, due to the switching from the normal operation mode to the low power mode, the input of the second circuit block is connected to the first voltage line so that it is prevented from going into the floating state. Thus, even in a semiconductor integrated circuit in which the second circuit block is connected with the latch circuit with a power supply thereto being turned off during the low power mode, it is possible to prevent the feedthrough current from flowing through the second circuit block and to prevent the second circuit block from malfunctioning during the low power mode.

When the low power mode is switched to the normal operation mode, the plate voltage generator generates a first plate voltage signal on the first plate line. Due to the voltage change on the first plate line, voltages according to residual dielectric polarization values of the pairs of first and second ferroelectric capacitors appear at the input and the output of the latch circuit. The data held in the latch circuit before the turning-off of the power supply is re-held in the latch circuit. The latch circuit outputs the held data to the second circuit block.

According to yet another aspect of the semiconductor integrated circuit of the present invention, when the normal operation mode is switched to the low power mode, the plate voltage generator changes the first and the second plate voltage signals from a low level to a high level for a predetermined period before the switch control signal is inactivated. Consequently, the data held in the latch circuit is surely written as the residual dielectric polarization of the ferroelectric capacitors and remains held even after the turning-off of the power supply.

According to yet another aspect of the semiconductor integrated circuit of the present invention, the first circuit block has a latch circuit and a pair of ferroelectric capacitors. The latch circuit has therein two buffer circuits with their inputs and outputs connected to each other and their power supply terminals connected to the virtual power supply line. The ferroelectric capacitors are connected in series between the first plate line and the second plate line, and connected to an input of one of the buffer circuits at a connecting node of the first ferroelectric capacitors.

When the normal operation mode is switched to the low power mode, the plate voltage generator generates first and second plate voltage signals on the first and the second plate line respectively. Due to the voltage change in the first plate line, the data held in the latch circuit before the turning-off of the power supply is maintained as residual dielectric polarization of the pair of ferroelectric capacitors. The residual dielectric polarization state is maintained even after the turning-off of the power supply. This means that the first circuit block operates as a nonvolatile latch circuit.

Thereafter, an output of the powered-off latch circuit is brought into a floating state. However, due to the switching of the normal operation mode to the low power mode, the input of the second circuit block is connected to the first voltage line, and thereby prevented from going into the floating state. Thus, even in a semiconductor circuit having the second circuit block connected with the latch circuit with a power supply thereto being turned off during the low power mode, it is possible to prevent the feedthrough current from flowing through the second circuit block and the second circuit block from malfunctioning during the low power mode.

When the low power mode is switched to the normal operation mode, the plate voltage generator generates a first plate voltage signal on the first plate line. Due to the voltage change on the first plate line, voltages according to the residual dielectric polarization values of the pair of ferroelectric capacitors appear at the input and the output of the latch circuit. The data held in the latch circuit before the turning-off of the power supply is re-held in the latch circuit. The latch circuit outputs the held data to the second circuit block.

According to yet another aspect of the semiconductor integrated circuit of the present invention, the first switch is constituted of a transistor of a first conductive type, and the second switch is constituted of a transistor of a second conductive type that is reverse in polarity to the first conductive type. Therefore, the first switch is on and the second switch is off while the switch control signal is activated. The first switch is off and the second switch is on while the switch control signal is inactivated. Therefore, the first and the second switches can be both controlled only with one switch control signal.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Figure 1:
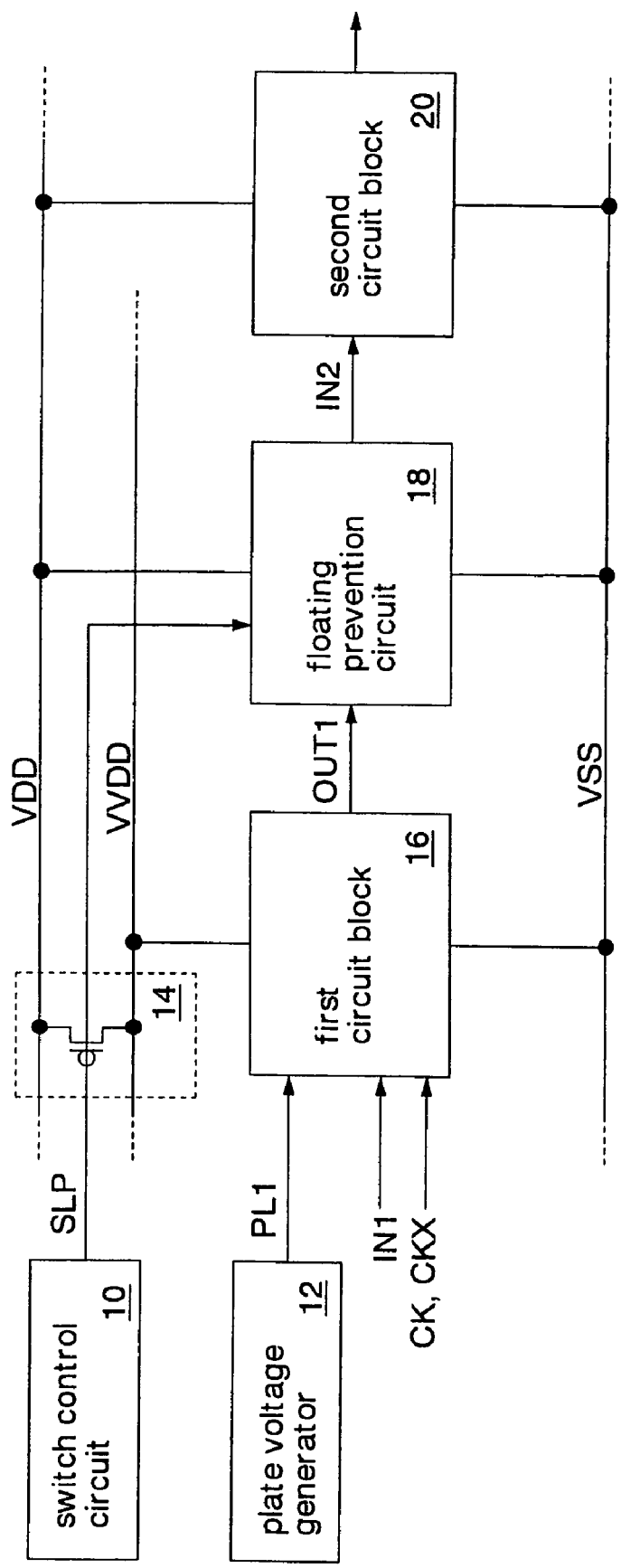
FIG. 1 is a block diagram showing a semiconductor integrated circuit of a first embodiment of the present invention.

The present invention will solve the following problems which occur when a circuit block to which the MTCMOS technique is adopted (hereinafter, referred to also as a first circuit block) is connected with a circuit block directly connected to a power supply line, in other words, a circuit block without the MTCMOS technique (hereinafter, referred to also as a second circuit block).

When an output of the first circuit block goes into a floating state during the standby period, an input of the second circuit block also goes into the floating state. As a result, a feedthrough current flows through a transistor in the second circuit block, resulting in the increase in power consumption during the standby period.

The above-mentioned feedthrough current can be prevented by connecting a pullup resistor or a pulldown resistor to the input of the second circuit block. However, this kind of resistor hinders the reduction in power consumption since a current is constantly passed therethrough.

Hereinafter, embodiments of the present invention will be explained using the drawings. In the explanation below, a signal line and a signal transmitted to the signal line are sometimes denoted by the same reference numeral and symbol.

FIG. 1 shows a first embodiment of a semiconductor integrated circuit of the present invention. This semiconductor integrated circuit is formed on a silicon substrate, using a CMOS process.

The semiconductor integrated circuit has a switch control circuit 10, a plate voltage generator 12, a sleep switch (first switch) 14, a first circuit block 16, a floating prevention circuit 18, and a second circuit block 20.

The switch control circuit 10 outputs a sleep signal (switch control signal) SLP according to the operation mode of the semiconductor integrated circuit. The sleep signal SLP is kept at a low level (activated) during a normal operation mode and kept at a high level (inactivated) during a sleep mode which is a low power mode.

The plate voltage generator 12 generates a pulsed first plate voltage signal PL1 in a first plate line PL1 when the mode of the semiconductor integrate circuit is switched from the normal operation mode to the sleep mode and from the sleep mode to the normal operation mode.

The sleep switch 14 is constituted of a pMOS transistor (transistor of a first conductive type) that is connected to a normal power supply line VDD, a virtual power supply line VVDD, and a signal line of the sleep signal SLP at a source, a drain, and a gate thereof respectively. The sleep switch 14 is on during the normal operation mode in response to the sleep signal SLP of the low level, and is off during the sleep mode in response to the sleep signal SLP of the high level. When the sleep switch 14 turns on, the virtual power supply line VVDD is connected to the normal power supply line VDD. Here, a power supply voltage VDD is constantly supplied to the normal power supply line VDD. The power supply voltage VDD may be supplied from an exterior of the semiconductor integrated circuit via an external terminal (external power supply voltage), or may be generated by stepping down the external power supply voltage in the semiconductor integrated circuit.

The first circuit block 16 functions as a nonvolatile latch circuit. The first circuit block 16 latches an input signal IN1 in synchronization with clock signals CK, CKX while a power supply terminal thereof is supplied with the power supply voltage VDD via the virtual power supply line VVDD.

The floating prevention circuit 18 transfers a signal (output signal OUT1), which is latched by the first circuit block 16 when the sleep signal SLP is at the low level, to the second circuit block 20. The floating prevention circuit 18 fixes an input IN2 of the second circuit block circuit 20 to a high level while the sleep signal SLP is at the high level. Power supply terminals of the floating prevention circuit 18 are directly connected to the normal power supply line VDD and a ground line VSS respectively. This means that the floating prevention circuit 18 constantly operates independently from the sleep signal SLP.

The second circuit block 20 has a function of, for example, a decoder, a data path circuit, or the like. The second circuit block 20 operates according to the input signal IN2 and not-shown other input signals. Power supply terminals of the second circuit block 20 are directly connected to the normal power supply line VDD and the ground line VSS respectively. This means that the second circuit block 20 constantly operates independently from the sleep signal SLP.

Figure 2:
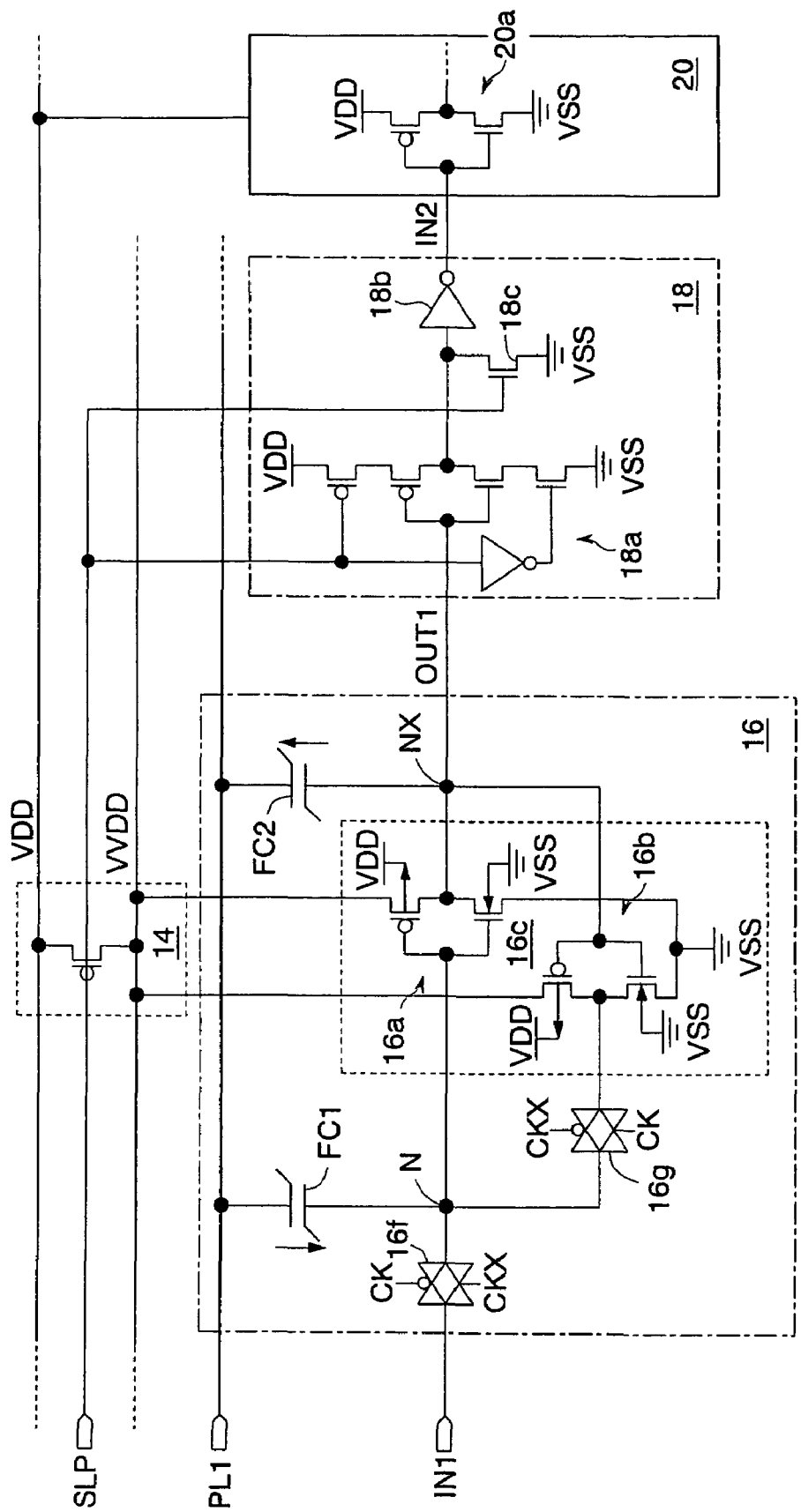
FIG. 2 is a circuit diagram showing an essential part of the first embodiment.

FIG. 2 shows in detail the first circuit block 16, the floating prevention circuit 18, and the second circuit block 20 which are shown in FIG. 1. Hereinafter, the first circuit block 16 is referred to also as a nonvolatile latch circuit 16.

The nonvolatile latch circuit 16 has a latch circuit 16c having therein two CMOS inverters (buffer circuits) 16a, 16b with their inputs and outputs connected to each other, a pair of ferroelectric capacitors FC1, FC2, and CMOS switches 16f, 16g. Substrates of a pMOS transistor and an nMOS transistor constituting the CMOS inverters 16a, 16b are connected to the normal power supply line VDD and the ground line VSS respectively.

The ferroelectric capacitor FC1 is connected to an input node N of the CMOS inverter 16a at one end thereof and is connected to a plate line PL1 at the other end thereof. The ferroelectric capacitor FC2 is connected to an input node NX of the CMOS inverter 16b at one end thereof and is connected to the plate line PL1 at the other end thereof. The directions of the arrows by the ferroelectric capacitors FC1, FC2 show their polarization states. Electrodes on a tip side of the arrows are positively charged.

The CMOS switch 16f connects the input IN1 of the nonvolatile latch circuit 16 to the input node N of the CMOS inverter 16a. The CMOS switch 16f turns on when the clock signal CK is at a low level (=a clock signal CKX is at a high level). The CMOS switch 16g connects an output of the CMOS inverter 16b to an input of the CMOS inverter 16a. The CMOS switch 16g turns on when the clock signal CK is at the high level (=the clock signal CKX is at the low level).

The nonvolatile latch circuit 16 stores data held in the latch circuit 16c in the ferroelectric capacitors FC1, FC2 (store operation) when the normal operation mode is switched to the sleep mode. The polarization states of the ferroelectric capacitors FC1, FC2 become reverse to each other due to the store operation. Holding the data as the residual dielectric polarization of the ferroelectric capacitors FC1, FC2 prevents the data from being lost even during the sleep mode in which the supply of the power supply voltage is suspended. When the sleep mode is switched to the normal operation mode, the nonvolatile latch circuit 16 transfers the residual dielectric polarization of the ferroelectric capacitors FC1, FC2 to the latch circuit 16c as data (recall operation).

The floating prevention circuit 18 has a clocked inverter 18a and a CMOS inverter 18b, which are connected in cascade, and an nMOS transistor 18c (a transistor of a second conductive type, a floating prevention switch).

The clocked inverter 18a turns on in response to the activation (low level) of the sleep signal SLP to connect the output OUT1 of the first circuit block 16 to the input IN2 of the second circuit block 20 via the inverter 18c (normal operation mode). The clocked inverter 18a turns off in response to the inactivation (high level) of the sleep signal SLP to disconnect the signal transmission the connection between the output OUT1 and the input IN2 (sleep mode).

The nMOS transistor 18c is connected to the ground line VSS (first voltage line) at a source thereof, is connected to an output of the clocked inverter 18a (connecting node of the first circuit block 16 and the second circuit block 20) at a drain thereof, and receives the sleep signal SLP at a gate thereof. Receiving the activation (low level) of the sleep signal SLP at the gate, the nMOS transistor 18c turns off to disconnect an input node of the CMOS inverter 18b from the ground line VSS (normal operation mode). Receiving the inactivation (high level) of the sleep signal SLP at the gate, the nMOS transistor 18c turns on to supply a fixed low level to the input of the CMOS inverter 18b (sleep mode).

The second circuit block 20 has the function of the decoder or the like as stated above. The second circuit block 20 receives the input signal IN2 at a CMOS inverter 20a on an initial stage.

Note that the PMOS transistor as the sleep switch 14 has a first threshold voltage, and each of the pMOS transistors in the first circuit block 16 has a second threshold voltage which is lower than the first threshold voltage. Each of the pMOS transistors in the second circuit block 20 has a third threshold voltage which is higher than the second threshold voltage. The first threshold voltage and the third threshold voltage may be equal. Further, The floating prevention circuit 18 has a clocked inverter 18a and a CMOS inverter 18b, which are connected in cascade, and an nMOS transistor 18c (a transistor of a second conductive type, a floating prevention switch).

The clocked inverter 18a turns on in response to the activation (low level) of the sleep signal SLP to connect the output OUT1 of the first circuit block 16 to the input IN2 of the second circuit block 20 via the inverter 18c (normal operation mode). The clocked inverter 18a turns off in response to the inactivation (high level) of the sleep signal SLP to disconnect the signal transmission between the output OUT1 and the input IN2 (sleep mode).

The nMOS transistor 18c is connected to the ground line VSS (first voltage line) at a source thereof, is connected to an output of the clocked inverter 18a (connecting node of the first circuit block 16 and the second circuit block 20) at a drain thereof, and receives the sleep signal SLP at a gate thereof. Receiving the activation (low level) of the sleep signal SLP at the gate, the nMOS transistor 18c turns off to disconnect an input node of the CMOS inverter 18b from the ground line VSS (normal operation mode). Receiving the inactivation (high level) of the sleep signal SLP at the gate, the nMOS transistor 18c turns on to supply a fixed low level to the input of the CMOS inverter 18b (sleep mode).

The second circuit block 20 has the function of the decoder or the like as stated above. The second circuit block 20 receives the input signal IN2 at a CMOS inverter 20a on an initial stage.

Note that the pMOS transistor as the sleep switch 14 has a first threshold voltage, and each of the pMOS transistors in the first circuit block 16 has a second threshold voltage which is lower than the first threshold voltage. Each of the PMOS transistors in the second circuit block 20 has a third threshold voltage which is higher than the second threshold voltage. The first threshold voltage and the third threshold voltage may be equal. Further, a threshold voltage of each of the nMOS transistors in the first circuit block 16 is lower than a threshold voltage of each of the nMOS transistors in the second circuit block 20. In other words, this semiconductor integrated circuit adopts the MTCMOS technique. When a power supply terminal of a circuit block having a transistor with a low threshold voltage is disconnected from a power supply line during the sleep mode, power consumption during the sleep mode is reduced. Moreover, taking advantage of the low threshold voltage the semiconductor integrated circuit can operate at high speed during the normal operation.

Figure 3:
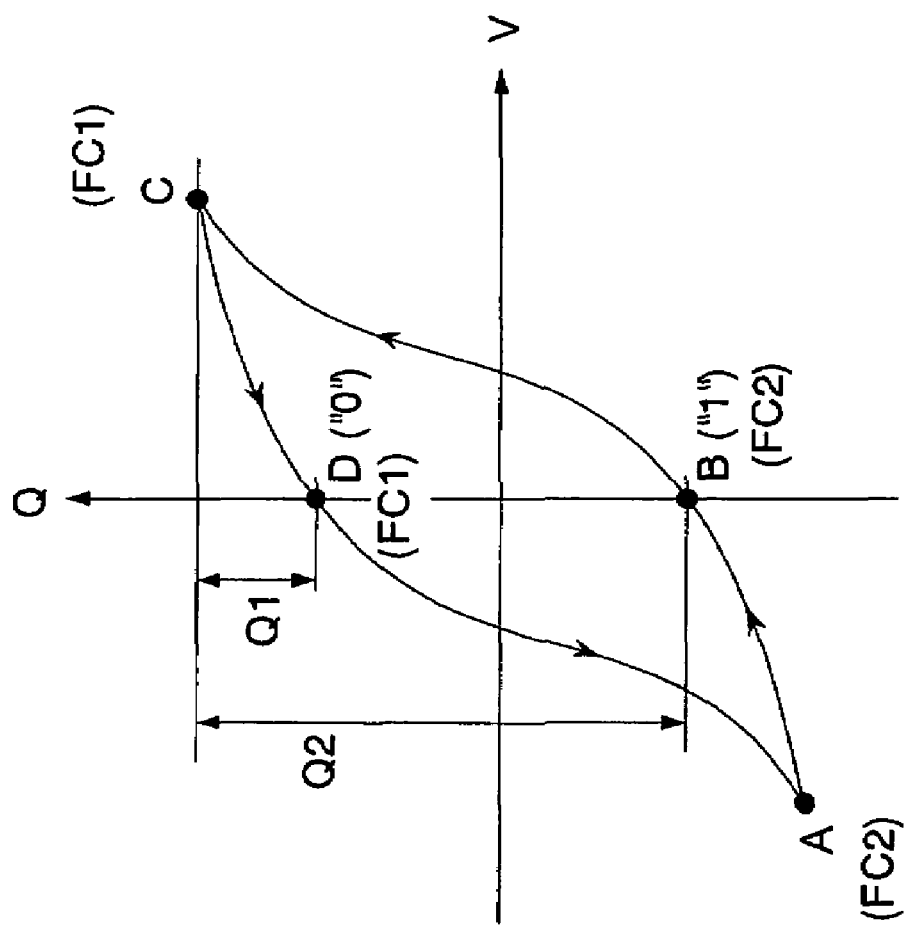
FIG. 3 is a characteristic chart showing the outline of polarization operations of ferroelectric capacitors in the first embodiment.

FIG. 3 shows the outline of polarization operations of the ferroelectric capacitors FC1, FC2.

In the drawing, the horizontal axis shows a voltage V applied to both ends of each of the ferroelectric capacitors FC1, FC2, and the vertical axis shows a polarization charge Q of each of the ferroelectric capacitors FC1, FC2. The voltage V is a voltage of the first plate line PL1 when nodes N, NX are defined as references.

First, a description will be made on the store operation in which the data held in the latch circuit 16c is written to the ferroelectric capacitors FC1, FC2. In this example, the nodes N, NX are assumed to be at a low level and a high level respectively. When the first plate voltage signal PL1 is at a low level, a voltage difference between both ends of the ferroelectric capacitor FC1 is 0 V. Therefore, the characteristic of the ferroelectric capacitor FC1 is positioned at a point B or a point D. A voltage difference between both ends of the ferroelectric capacitor FC2 is negative. Therefore, the characteristic of the ferroelectric capacitor FC2 is positioned at a point A.

When the first plate voltage signal PL1 goes to a high level, the voltage difference between both ends of the ferroelectric capacitor FC1 becomes positive. Therefore, the characteristic of the ferroelectric capacitor FC1 shifts to a point C. Meanwhile, the voltage difference between both ends of the ferroelectric capacitor FC2 becomes 0 V. Therefore, the characteristic of the ferroelectric capacitor FC2 shifts to the point B.

When the first plate voltage signal PL1 goes to the low level again, the voltage difference between both ends of the ferroelectric capacitor FC1 becomes 0 V. Consequently, the characteristic of the ferroelectric capacitor FC1 shifts from the point C to the point D. The voltage difference between both ends of the ferroelectric capacitor FC2 becomes negative. Consequently, the characteristic of the ferroelectric capacitor FC2 shifts from the point B to the point A. The data held in the latch circuit 16c at this instant is maintained as the residual dielectric polarization on the ferroelectric capacitors FC1, FC2 even after the supply of the power supply voltage is stopped. In other words, power for maintaining the data is zero.

When the semiconductor integrated circuit enters the sleep mode according to a command signal or the like given from an exterior and the sleep signal SLP accordingly changes from the low level to the high level, the supply of the power supply voltage to the nonvolatile latch circuit 16 is stopped, so that the data indicating the voltage held in the latch circuit 16c is lost. The nodes N, NX are brought into a floating state, and voltages thereof gradually change to the ground voltage VSS. The first plate voltage signal PL1 is kept at the low level. Consequently, the voltage difference between both ends of each of the ferroelectric capacitors FC1, FC2 becomes 0 V, so that the characteristics of the ferroelectric capacitors FC1, FC2 are positioned at the point D and the point B respectively. Therefore, a logic "0" and a logic "1" are not lost and can be stored on the ferroelectric capacitors FC1, FC2 respectively.

Next, the recall operation of returning the data held in the ferroelectric capacitors FC1, FC2 to the latch circuit 16c will be explained.

When the first plate voltage signal PL1 goes to the high level in the state in which the power supply voltage to the nonvolatile latch circuit 16 is not supplied, the characteristics of the ferroelectric capacitors FC1, FC2 both shift to the point C. At this time, the voltage of the node N changes to a voltage according to a residual dielectric polarization value Q1 of the ferroelectric capacitor FC1. The voltage of the node NX changes to a voltage according to a residual dielectric polarization value Q2 of the ferroelectric capacitor FC2.

Assuming that the power supply voltage VDD is 3.3 V, average capacitances of the ferroelectric capacitors FC1, FC2 at the point D and the point B are 50 fF and 200 fF respectively, and parasitic capacitances of the nodes N, NX are 5 fF, the voltages of the nodes N, NX become 3 V and 3.2 V respectively due to a capacitance coupling effect.

Next, the sleep signal SLP goes to the low level in order to finish the sleep mode. The change in the sleep signal SLP causes the power supply voltage to be supplied to the latch circuit 16c. The latch circuit 16c amplifies a voltage difference between the nodes N, NX to restore the data held thereon before the sleep mode.

Figure 4:
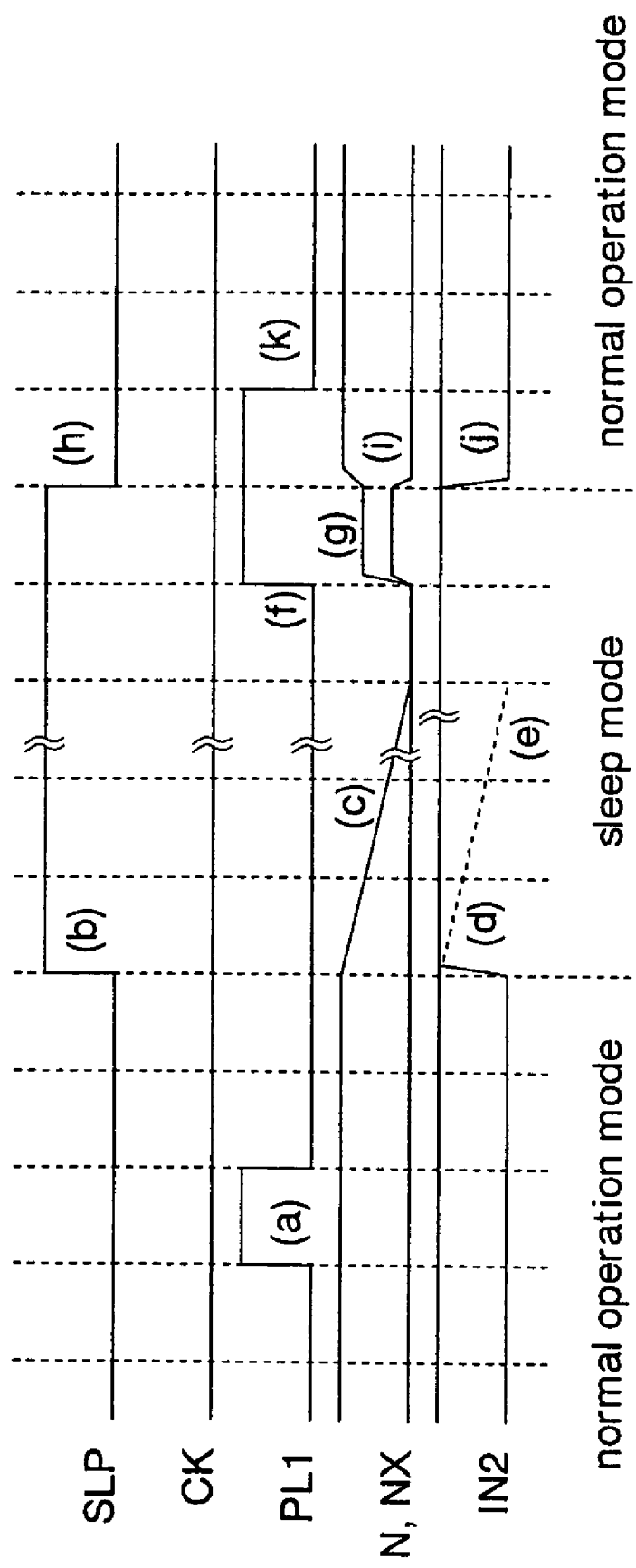
FIG. 4 is a timing chart showing the operation of the semiconductor integrated circuit of the first embodiment.

FIG. 4 shows the operation of the semiconductor integrated circuit of the first embodiment.

First, when the normal operation mode is shifted to the sleep mode, the plate voltage generator 12 shown in FIG. 1 outputs in the normal operation mode a pulse signal at a high level to the first plate line PL1 before the sleep signal SLP is inactivated (during the low level period) (FIG. 4(a)). The ferroelectric capacitors FC1, FC2 hold the data latched by the latch circuit 16c as described above.

Next, the switch control circuit 10 inactivates (high level) the sleep signal SLP to shift the mode of the semiconductor integrated circuit to the sleep mode (FIG. 4(b)). The sleep switch 14 interrupts the connection between the power supply line VDD and the virtual power supply line VVDD according to the sleep signal SLP. The suspension of the supply of the supply voltage to the nonvolatile latch circuit 16 brings the nodes N, NX into the floating state and the voltages thereof gradually change to the ground voltage VSS (FIG. 4(c)).

The clocked inverter 18a is inactivated in response to the high level of the sleep signal SLP. The nMOS transistor 18c turns on in response to the high level of the sleep signal SLP to fix the input of the CMOS inverter 18b to the low level. Consequently, the CMOS inverter 18b outputs the signal IN2 at a high level to the second circuit block 20 (FIG. 4(d)). As a result, the input of the second circuit block 20 is prevented from going into the floating state. This means that the flow of the feedthrough current to the second circuit block 20 during the sleep mode is prevented. In other words, it is prevented that an unstable input level is given to the input of the second circuit block 20 to cause the malfunction of the second circuit block 20. As a result, the increase in power consumption of the semiconductor integrated circuit during the sleep mode is prevented.

Incidentally, in a case where the second circuit block 20 is directly, not via the floating prevention circuit 18, connected to the nonvolatile latch circuit 16, the level of the signal IN2 turns to that in the floating state as shown by the dotted line in the drawing and gradually changes to the ground voltage VSS (FIG. 4(e)). At this time, the feedthrough current flows through the inverter 20a on the initial stage of the second circuit block 20.

When the sleep mode is returned to the normal operation mode, the first plate voltage signal PL1 changes to the high level during a period in which the sleep signal SLP is at the high level (FIG. 4(f)). The voltages of the nodes N, NX change to voltages according to the residual dielectric polarization values of the ferroelectric capacitors FC1, FC2 (FIG. 4(g)) as described above. In this event, the node NX is not electrically connected to a drain of the nMOS transistor 18c by the clocked inverter 18a. This makes it possible to bring the output node NX of the latch circuit 16c into the complete floating state in the recall operation. As a result, it is possible to generate the voltage corresponding to the residual dielectric polarization value of the ferroelectric capacitor FC2 at the node NX with high precision. In other words, it is possible to surely return the written data to the latch circuit.

Next, the sleep signal SLP is activated (low level) during the period in which the first plate voltage signal PL1 is at the high level (FIG. 4(h)). The sleep switch 14 connects the virtual power supply line VVDD to the power supply line VDD according to the sleep signal SLP. Due to the supply of the power supply voltage to the nonvolatile latch circuit 16, the latch circuit 16c amplifies the voltage difference between the nodes N, NX to restore the data which was held thereon before the sleep mode (FIG. 4(i)).

The nMOS transistor 18c turns off in response to the low level of the sleep signal SLP. The clocked inverter 18a is activated in response to the low level of the sleep signal SLP to transmit the output of the nonvolatile latch circuit 16 to the second circuit block 20 (FIG. 4(j)). Thereafter, the first plate voltage signal PL1 goes to the low level, so that the operation of the normal operation mode is started (FIG. 4(k)).

Figure 5:
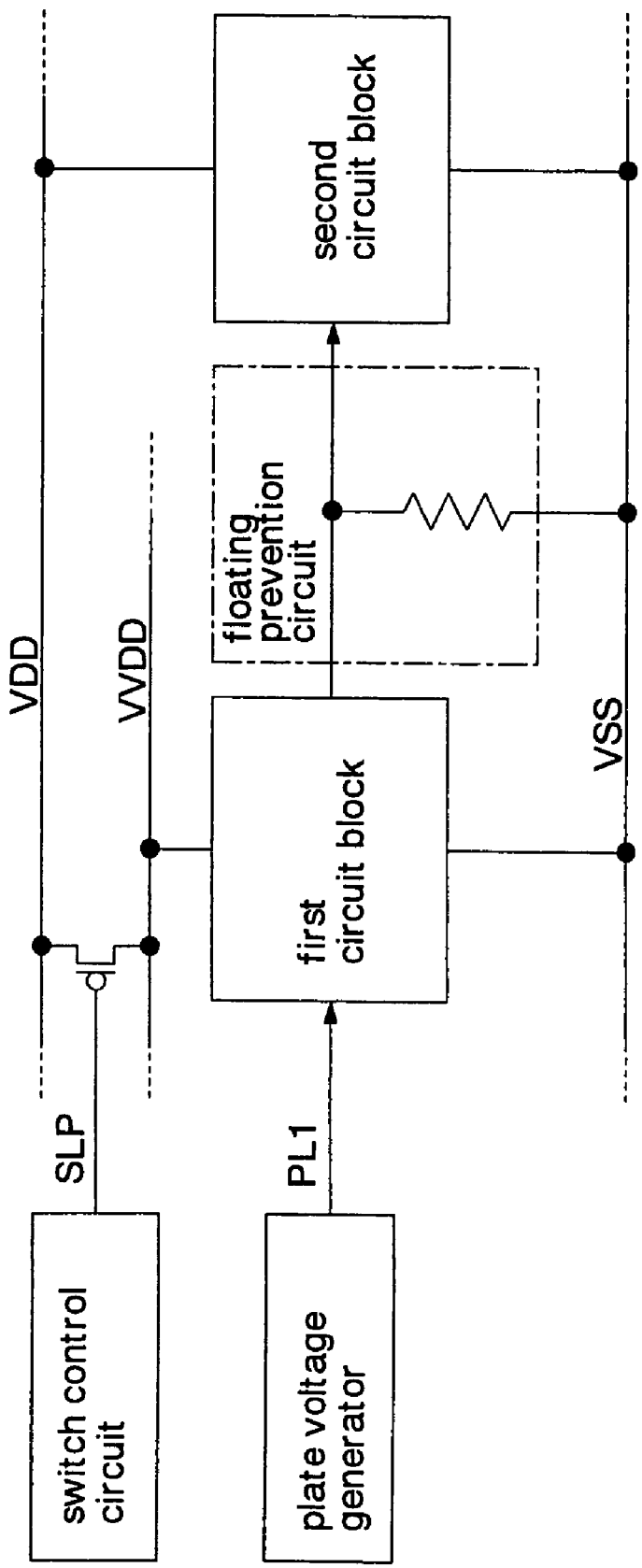
FIG. 5 is a block diagram showing a semiconductor integrated circuit proposed by the inventor before the present invention.

FIG. 5 shows a semiconductor integrated circuit proposed by the inventor before the present invention.

In this example, a floating prevention circuit is constituted of a pulldown resistor. A predetermined current constantly flows through the pulldown resistor irrespective of the normal operation mode or the sleep mode. This hinders the reduction in power consumption especially during the sleep mode. Further, in a case where a nonvolatile latch circuit having ferroelectric capacitors as shown in FIG. 2 is formed in a first circuit block, a node NX is constantly connected to a ground line VSS via the pulldown resistor. This means that the node NX is not in a complete floating state during the sleep mode. Therefore, when a first plate voltage signal PL1 goes to a high level in the recall operation, a voltage difference between the nodes N, NX may not be sufficiently large, which may cause the data not to be normally restored.

As described above, in the first embodiment, the nMOS transistor 18c that operates in synchronization with the sleep signal SLP is disposed between the ground line VSS and the connecting node connecting the output of the first circuit block 16 to the input of the second circuit block 20. In other words, when the power supply voltage VDD is not supplied to the latch circuit 16c of the first circuit block 16, the nMOS transistor 18c turns on. Consequently, the aforesaid connecting node can be connected to the ground line VSS in synchronization with the switching control from the normal operation mode to the sleep mode. Therefore, even when the power supply voltage is not supplied to the first circuit block 16, the input of the second circuit block 20 can be prevented from going into the floating state. As a result, the feedthrough current is prevented from flowing through the inverter 20a on the initial stage of the second circuit block 20. Moreover, the malfunction of the inverter 20a due to the receipt of the unstable input level is prevented. As a result, the increase in power consumption during the sleep mode can be prevented.

The sleep switch 14 is formed of the PMOS transistor and the floating prevention switch 18c is formed of the nMOS transistor, which makes it possible to control both the first circuit block 16 and the floating prevention circuit 18 only with one sleep signal SLP. In addition, the floating prevention circuit 18 can be constituted of a simple circuit including the nMOS transistor 18c. This makes it possible to minimize a wiring area of signal lines and an arrangement area of circuits, so that the increase in chip size of the semiconductor integrated circuit can be prevented.

The nMOS transistor 18c is off in response to the activation of the sleep signal SLP during the normal operation mode, so that the input node of the inverter 18b is brought into the floating state. Consequently, a data signal outputted from the latch circuit 16c during the normal operation mode is speedily and surely transmitted to the second circuit block 20.

The formation of the ferroelectric capacitors FC1, FC2 in the nonvolatile latch circuit 16 makes it possible to surely maintain the data held in the latch circuit as the residual dielectric polarization of the ferroelectric capacitors during the sleep mode in which the supply of the power supply voltage is suspended. Since a power supply is not required for maintaining data, further reduction in power consumption of the semiconductor integrated circuit is enabled.

The formation of the clocked inverter 18a receiving the output OUT1 in the latch circuit 16c in the floating prevention circuit 18 makes it possible to electrically disconnect the node NX from the drain of the nMOS transistor 18c during the sleep mode. Consequently, the output node NX of the latch circuit 16c can be in the complete floating state during the recall operation. As a result, the data written to the ferroelectric capacitors FC1, FC2 can be surely returned to the latch circuit.

Figure 6:
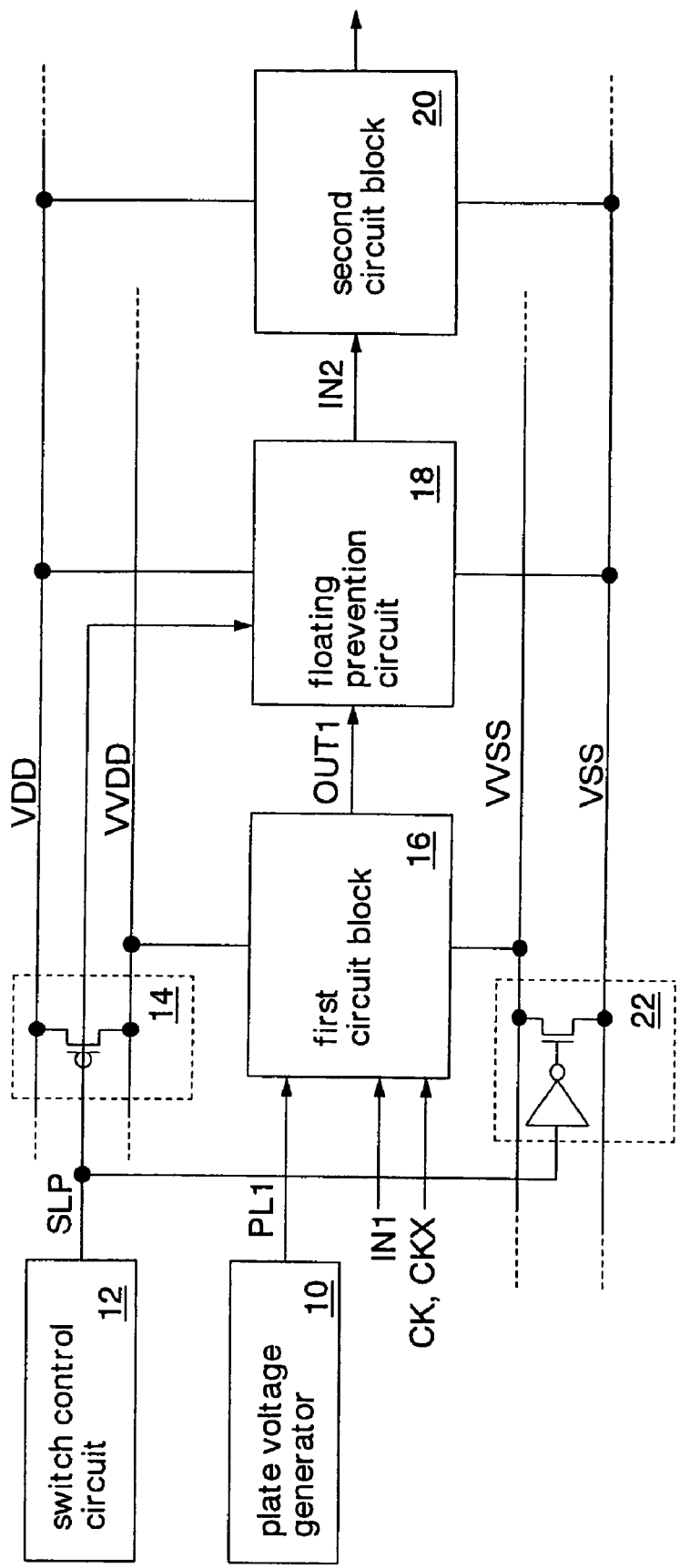
FIG. 6 is a block diagram showing a second embodiment of the semiconductor integrated circuit of the present invention.

FIG. 6 shows a second embodiment of the present invention. The same reference numerals and symbols are used to designate the same circuits and signals as those explained in the first embodiment, and detailed explanation thereof will be omitted.

In this embodiment, a first circuit block 16 is connected to a ground line (normal power supply line) VSS via a virtual ground line (virtual power supply line) VVSS. The virtual ground line VVSS is connected to the ground line VSS via a sleep switch 22. Other structures are the same as those of the first embodiment.

The sleep switch 22 is constituted of an inverter that inverts a sleep signal SLP and an nMOS transistor that receives an inverted signal of the sleep signal SLP at a gate thereof. A source and a drain of the nMOS transistor are connected to the ground line VSS and the virtual ground line VVSS respectively.

Figure 7:
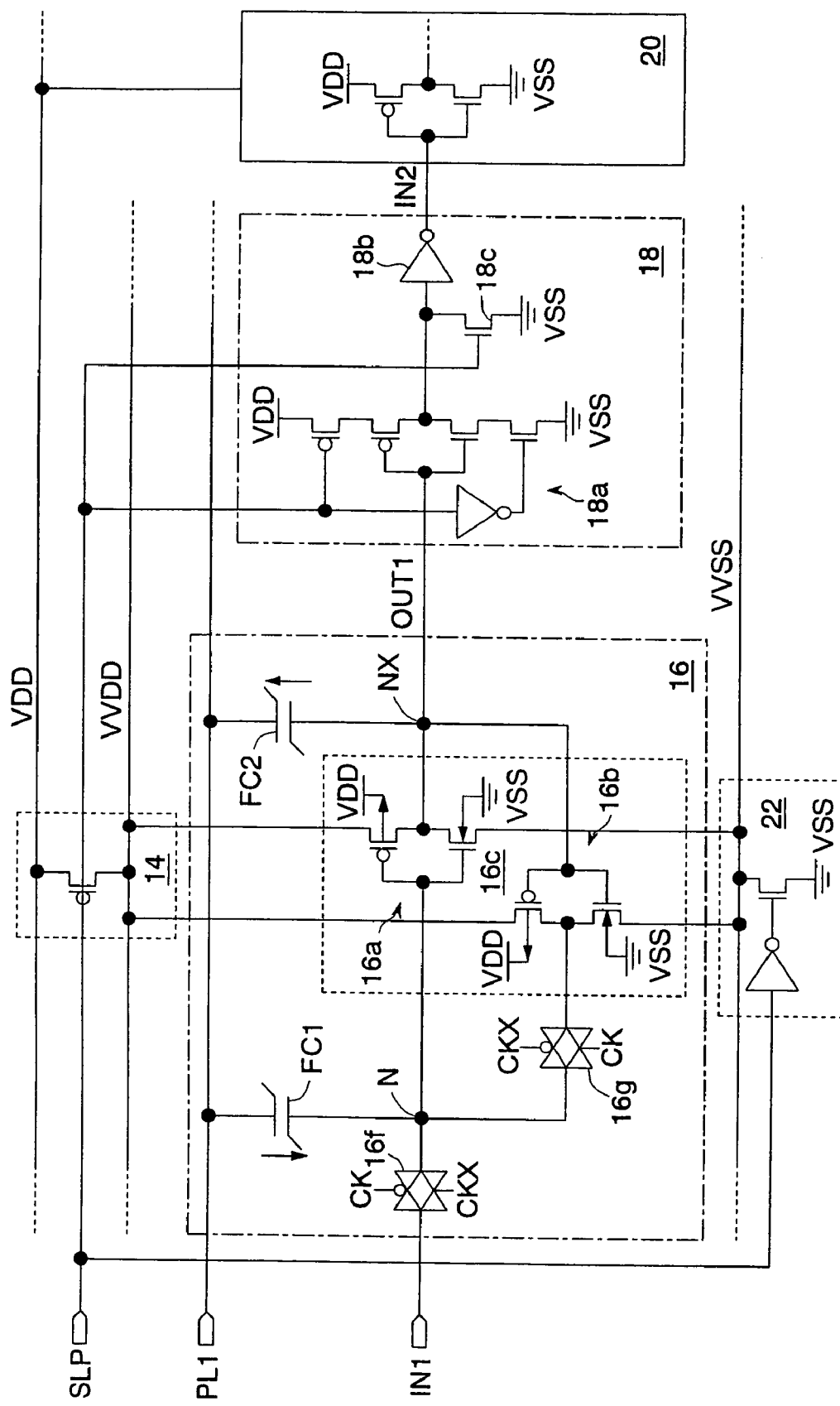
FIG. 7 is a circuit diagram showing an essential part of the second embodiment.

FIG. 7 shows in detail the first circuit block (nonvolatile latch circuit) 16 and a floating prevention circuit 18, and a second circuit block 20 which are shown in FIG. 6.

Sources of nMOS transistors in CMOS inverters 16a, 16b of the latch circuit 16c are connected to the virtual ground line VVSS. Other structures are the same as those of the first embodiment.

With the above-described structure, the same effects as those of the first embodiment described above can be also obtained in the second embodiment.

Figure 8:
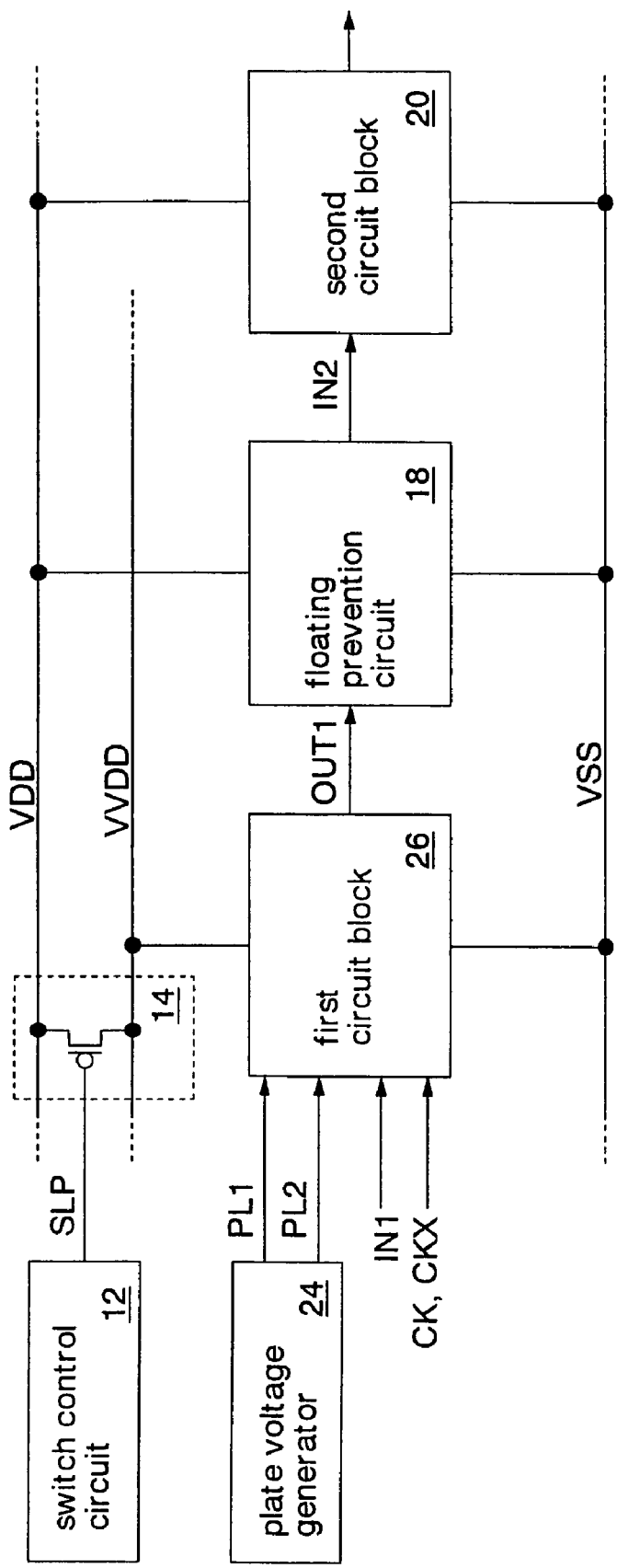
FIG. 8 is a block diagram showing a third embodiment of the semiconductor integrated circuit of the present invention.

FIG. 8 shows a third embodiment of the present invention. The same reference numerals and symbols are used to designate the same circuits and signals as those explained in the first embodiment, and detailed explanation thereof will be omitted.

In this embodiment, a plate voltage generator 24 and a first circuit block 26 are formed in place of the plate voltage generator 12 and the first circuit block 16 of the first embodiment. Other structures are the same as those of the first embodiment.

The plate voltage generator 24 generates not only a first plate voltage signal PL1 but also a second plate voltage signal PL2.

Figure 9:
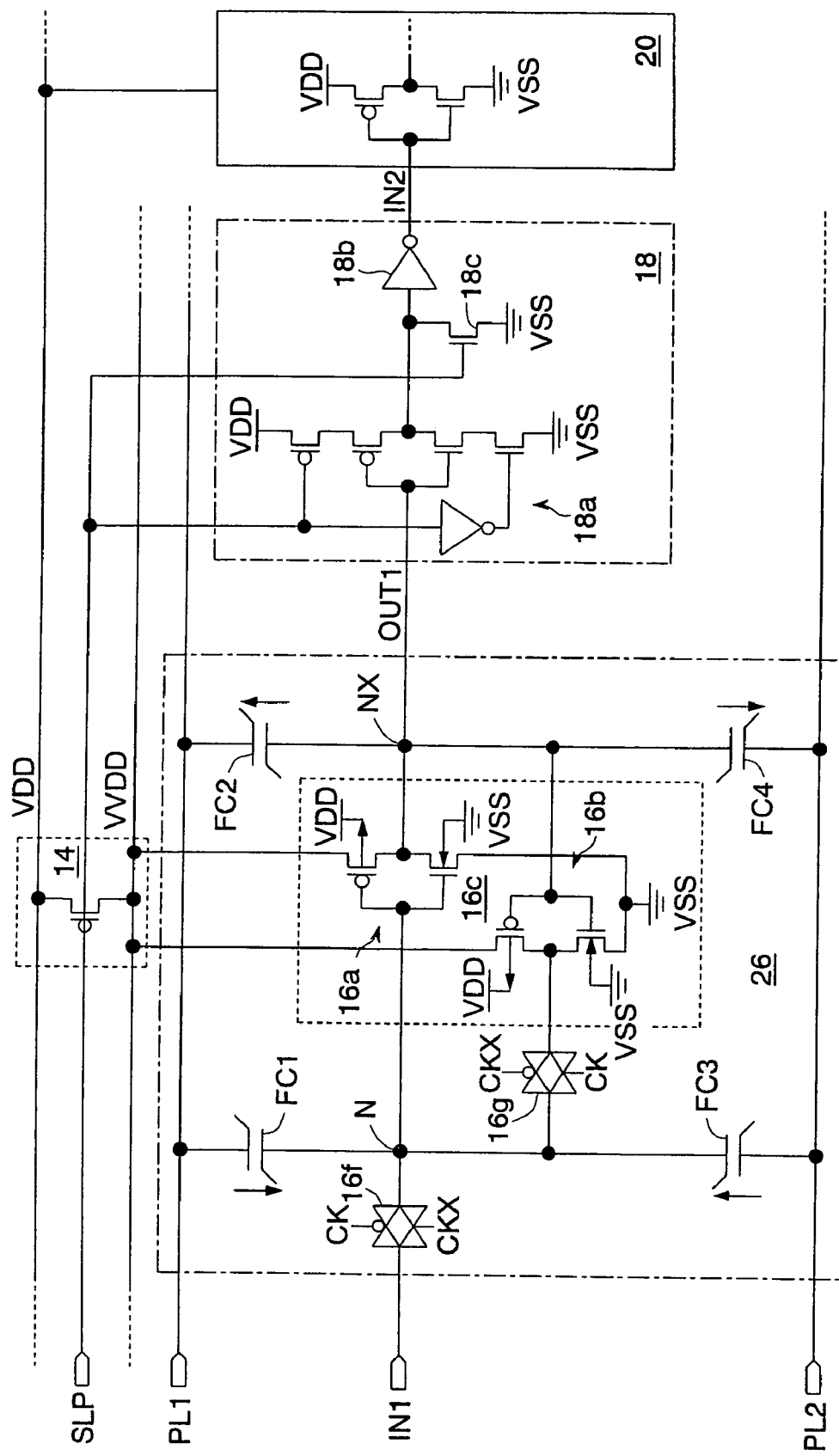
FIG. 9 is a circuit diagram showing an essential part of the third embodiment.

FIG. 9 shows in detail the first circuit block (nonvolatile latch circuit) 26, a floating prevention circuit 18, and a second circuit block 20 which are shown in FIG. 8.

The nonvolatile latch circuit 26 is constituted of the nonvolatile latch circuit 16 of the first embodiment to which ferroelectric capacitors FC3, FC4 are added. Specifically, the nonvolatile latch circuit 26 has a latch circuit 16c constituted of CMOS inverters 16a, 16b, a pair of first ferroelectric capacitors FC1, FC2, the pair of second ferroelectric capacitors FC3, FC4, and CMOS switches 16f, 16g.

The ferroelectric capacitor FC3 is connected to an input node N (intermediate node) of the CMOS inverter 16a at one end thereof and is connected to a second plate line PL2 at the other end thereof. The ferroelectric capacitor FC4 is connected to an input node NX (intermediate node) of the CMOS inverter 16b at one end thereof and is connected to the second plate line PL2 at the other end thereof.

Thus, the ferroelectric capacitors FC1, FC3 are disposed in series and the ferroelectric capacitors FC2, FC4 are disposed in series, between a first plate line PL1 and the second plate line PL2.

Figure 10:
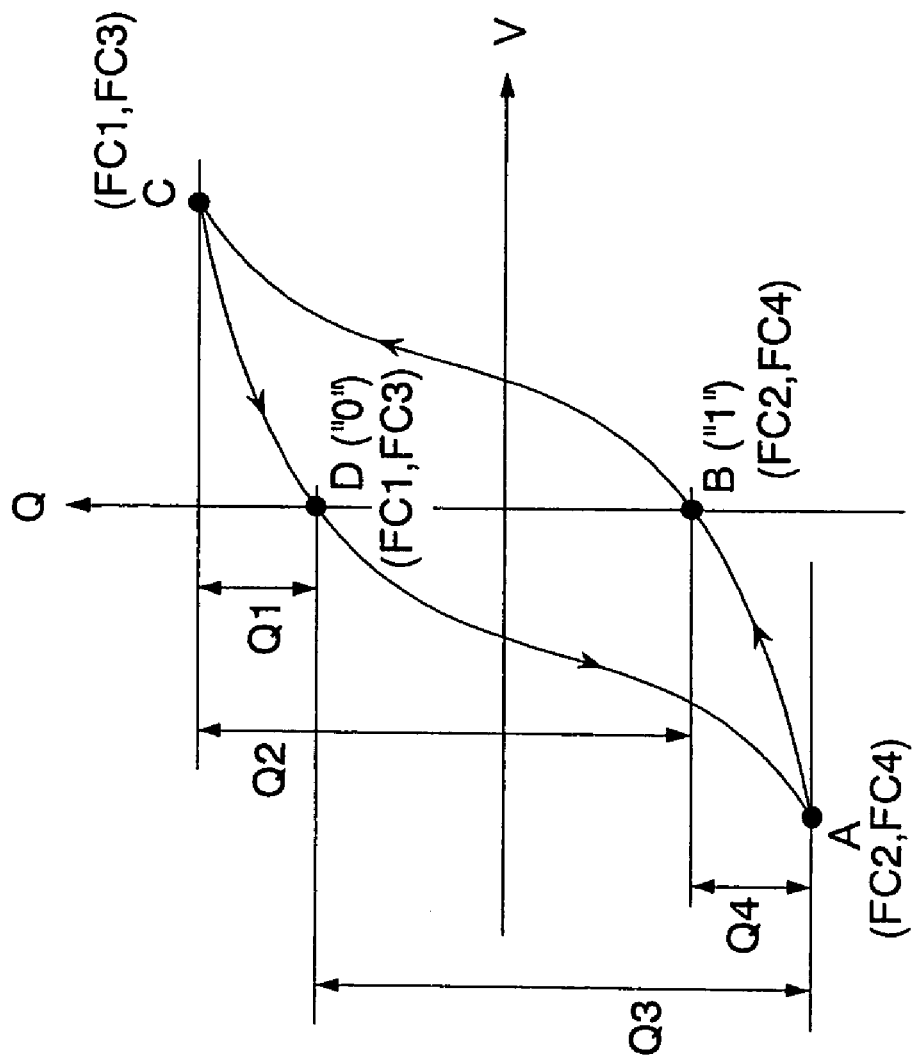
FIG. 10 is a characteristic chart showing the outline of polarization operations of ferroelectric capacitors in the third embodiment.

FIG. 10 shows the outline of polarization operations of the ferroelectric capacitors FC1, FC2, FC3, FC4.

First, a store operation when the nodes N, NX are at a low level and a high level respectively will be explained. In the store operation, each of the first and second plate voltage signals PL1, PL2 changes in the order of a low level, a high level, and a low level before a sleep signal SLP is inactivated (during a low level period). This means that a positive pulse signal is generated. When the first and second plate voltage signals PL1, PL2 are at the low level, the characteristics of the ferroelectric capacitors FC1, FC3 are positioned at a point B or a point D similarly to FIG. 3 described above. The characteristics of the ferroelectric capacitors FC2, FC4 are positioned at a point A.

When the first and second plate voltage signals PL1, PL2 change to the high level, the characteristics of the ferroelectric capacitors FC1, FC3 shift to a point C. The characteristics of the ferroelectric capacitors FC2, FC4 shift to the point B.

When the first and second plate voltage signals PL1, PL2 change to the low level again, the characteristics of the ferroelectric capacitors FC1, FC3 shift from the point C to the point D. The characteristics of the ferroelectric capacitors FC2, FC4 shift from the point B to the point A. Data held in the latch circuit 16c at this instant is maintained as residual dielectric polarization in the pair of ferroelectric capacitors FC1, FC3 and the pair of ferroelectric capacitors FC2, FC4.

When the semiconductor integrated circuit enters the sleep mode and the sleep signal SLP accordingly changes from a low level to a high level, the supply of a power supply voltage to the nonvolatile latch circuit 26 is stopped, so that the data held in the latch circuit 16c is lost. The nodes N, NX are brought into the floating state and the voltages thereof gradually vary to the ground voltage VSS. The first and second plate voltage signals PL1, PL2 are kept at the low level. This causes a voltage difference among the ferroelectric capacitors FC1, FC2, FC3, FC4 to be 0 V. Consequently, the characteristics of the ferroelectric capacitors FC1, FC3 and the characteristics of the ferroelectric capacitors FC2, FC4 are positioned at a point D and a point B respectively during the sleep mode. Therefore, a logic "0" and a logic "1"

are not lost and stored in the ferroelectric capacitors FC1, FC3 and the ferroelectric capacitors FC2, FC4 respectively.

In a recall operation of returning the sleep mode to a normal operation mode, the first plate voltage signal PL1 goes to the high level while the second plate voltage signal PL2 is kept at the low level in the state in which the supply of the power supply voltage to the nonvolatile latch circuit 16 is suspended. At this time, the ferroelectric capacitors FC1, FC2 receive the same positive voltages as those in the store operation. This causes the characteristics of the ferroelectric capacitors FC1, FC2 to shift to the point C from the point D and the point B respectively. A charge according to a residual dielectric polarization value Q1 is generated in the node N, and a charge according to a residual dielectric polarization value Q2 is generated in the node NX. Note that FC1<FC2 since capacitance values of the ferroelectric capacitors FC1, FC2 correspond to the residual dielectric polarization values Q1, Q2.

Since the first plate line PL1 goes to the high level while the second plate line PL2 is grounded, the ferroelectric capacitors FC3, FC4 receive negative voltages contrary to those in the store operation. The characteristics of the ferroelectric capacitors FC3, FC4 shift to the point A from the point D and the point B respectively. Consequently, a charge according to a residual dielectric polarization value Q3 is generated in the node N, and a charge according to a residual dielectric polarization value Q4 is generated in the node NX. Note that FC4<FC3 since capacitance values of the ferroelectric capacitors FC3, FC4 correspond to the residual dielectric polarization values.

During the period in which the first plate line PL1 is at the high level, the sleep signal SLP is activated (changed from the high level to the low level) and the latch circuit 16c is accordingly activated. The latch circuit 16c latches voltage levels of the nodes N, NX that change according to the residual dielectric polarization values, similarly to the first embodiment.

Figure 11:
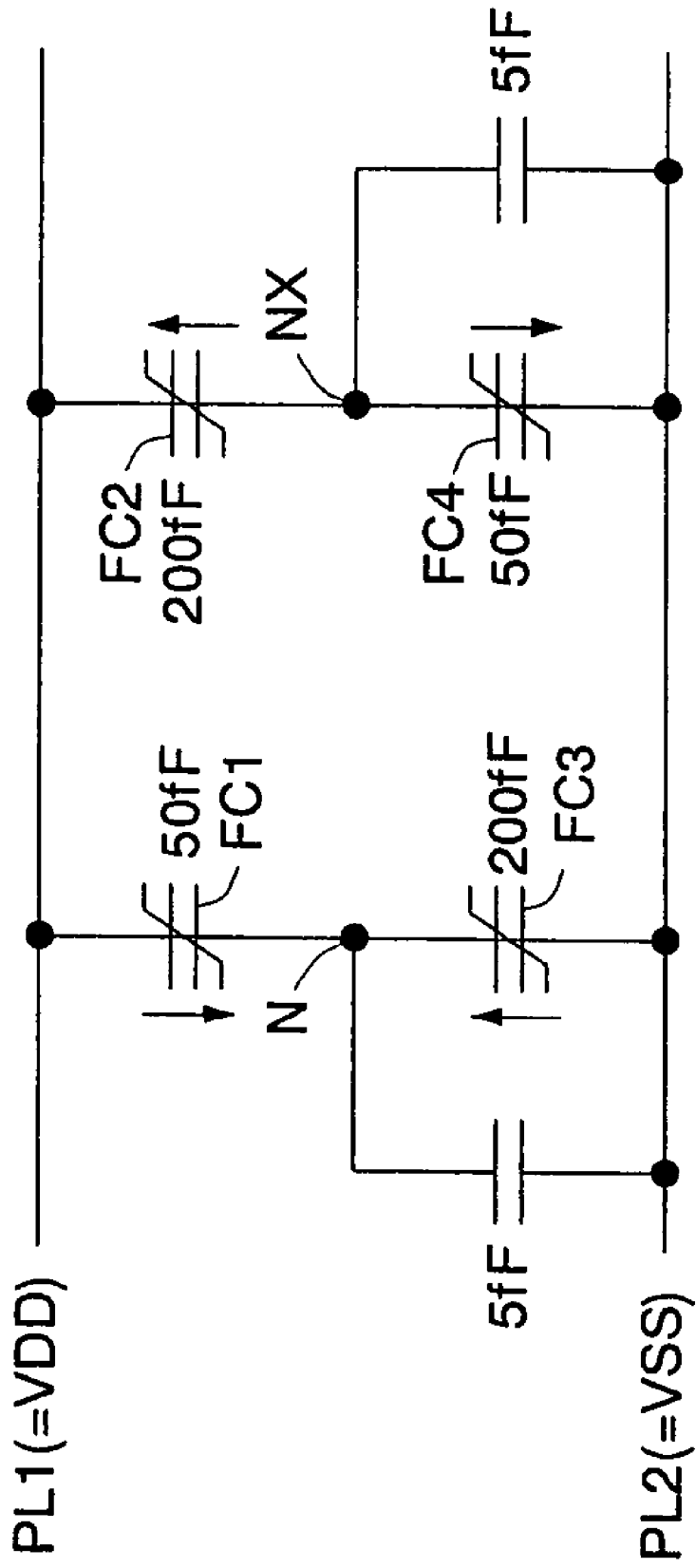
FIG. 11 is an equivalent circuit diagram of a capacitance of a nonvolatile latch circuit in the third embodiment.

FIG. 11 shows an equivalent circuit of a capacitance of the nonvolatile latch circuit 26 after the above-described store operation.

In this example, average capacitances corresponding to the polarization states of the ferroelectric capacitors FC1, FC2, FC3, and FC4 are assumed to be 50 fF, 200 fF, 200 fF, and 50 fF respectively. Parasitic capacitances of the nodes N, NX when the second plate line PL2 is grounded is assumed to be 5 fF. When a high level voltage of the first plate voltage signal PL1 in the recall operation is defined as VDD, voltages VN, VNX of the nodes N, NX can be expressed by the expressions (1) and (2) respectively.

$$VN = VDD \times 50 \text{ fF}/(5 \text{ fF} + 50 \text{ fF} + 200 \text{ fF}) \quad (1)$$

$$VNX = VDD \times 200 \text{ fF}/(5 \text{ fF} + 50 \text{ fF} + 200 \text{ fF}) \quad (2)$$

When the power supply voltage VDD is 3.3 V, the voltages VN, VNX are 0.65 V and 2.59 V respectively. Therefore, a voltage difference between the nodes N, NX after the first plate voltage signal PL1 changes from the low level to the high level (corresponding to FIG. 4(f) described above) is 1.94 V in the recall operation. Consequently, when the sleep signal SLP goes to the low level in order to finish the sleep mode and the power supply voltage is supplied to the latch circuit 16c, the latch circuit 16c is capable of easily amplifying the voltage difference between the nodes N, NX. In other words, the formation of the two pairs of ferroelectric capacitors FC1/FC3 and FC2/FC4 in the nonvolatile latch circuit 26 makes it possible to surely restore the data by the recall operation.

With the above-described structure, the same effects as those in the above-described first embodiment can be also obtained in the third embodiment. Moreover, in this embodiment, the ferroelectric capacitors FC2, FC3 (the pair of first ferroelectric capacitors) are connected in series and the ferroelectric capacitors FC2, FC4 (the pair of second ferroelectric capacitors) are connected in series, between the first plate line PL1 and the second plate line PL2, and the intermediate nodes therebetween are connected to inputs of the CMOS inverters 16a, 16b respectively. Consequently, offset voltages of the nodes N, NX can be increased by the capacitance division, so that the data held in the latch circuit 16c before the turning-off the power supply can be surely restored.

Figure 12:
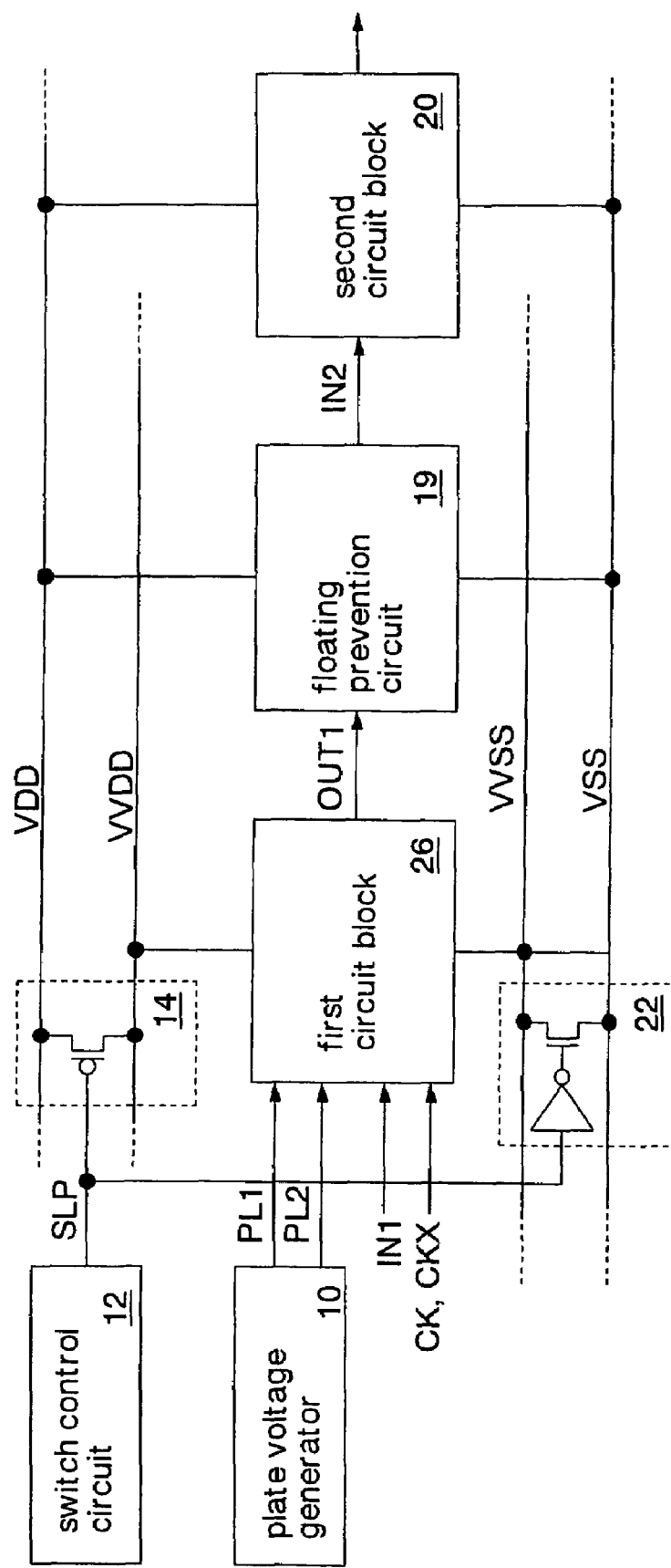
FIG. 12 is a block diagram showing a fourth embodiment of the semiconductor integrated circuit of the present invention.

FIG. 12 shows a fourth embodiment of the present invention. In this embodiment, the same reference numerals and symbols are used to designate the same circuits and signals as those explained in the first to third embodiments, and detailed explanation thereof will be omitted.

In this embodiment, a floating prevention circuit 19 is formed in place of the floating prevention circuit 18 of the third embodiment. A first circuit block 26 is connected to a ground line VSS via a virtual ground line VVSS The virtual ground line VVSS is connected to the ground line VSS via a sleep switch 22. Other structures are the same as those of the third embodiment.

Figure 13:
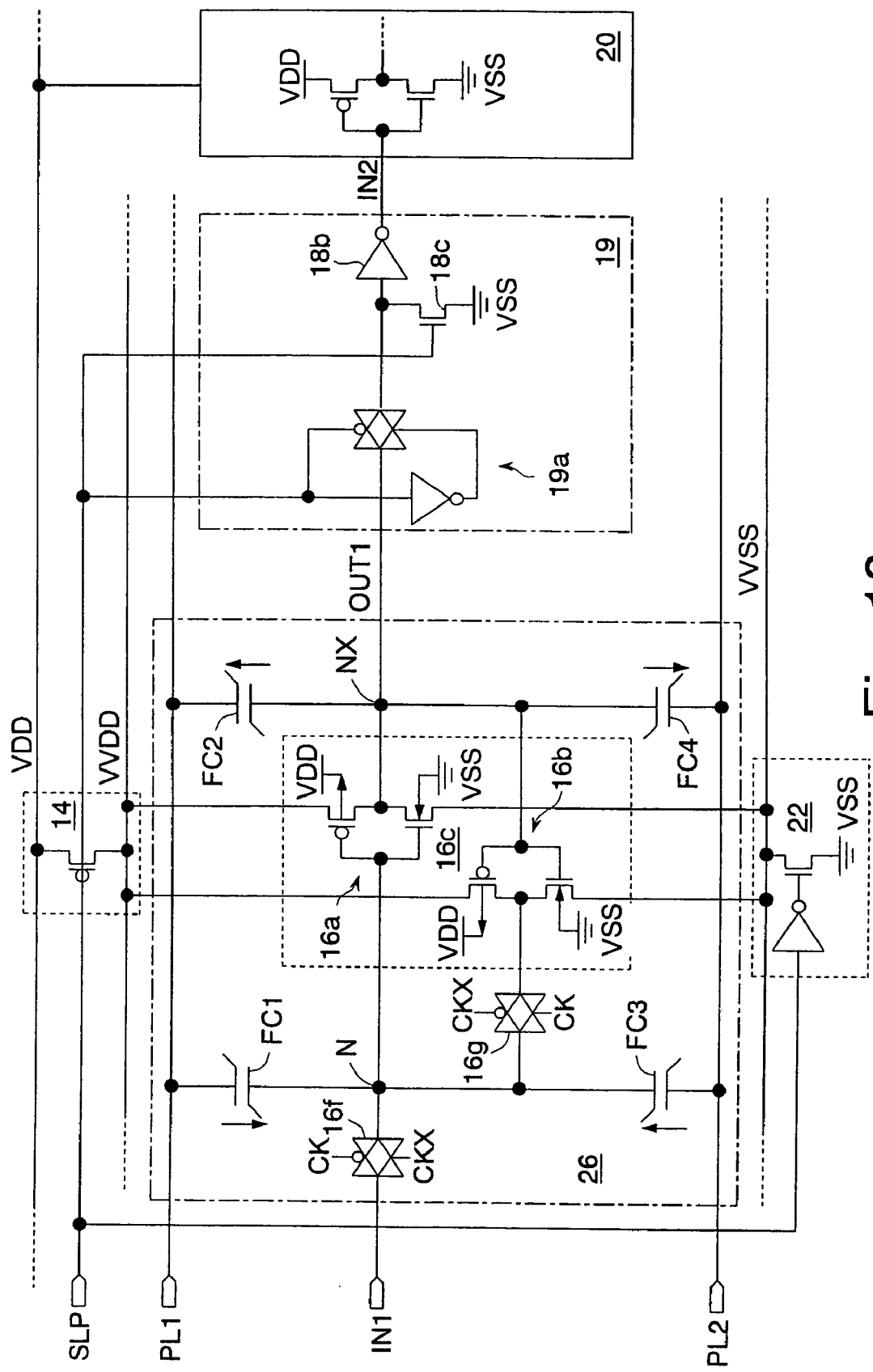
FIG. 13 is a circuit diagram showing an essential part of the fourth embodiment.

FIG. 13 shows in detail the first circuit block (nonvolatile latch circuit) 26, the floating prevention circuit 19, and a second circuit block 20 which are shown in FIG. 12.

Sources of nMOS transistors in CMOS inverters 16a, 16b of a latch circuit 16c are connected to the virtual ground line VVSS. The floating prevention circuit 19 has a CMOS switch 19a in place of the clocked inverter 18a of the third embodiment (FIG. 9). The CMOS switch 19a turns on in response to the activation (low level) of a sleep signal SLP (normal operation mode), and turns off in response to the inactivation (high level) of the sleep signal SLP (sleep mode). Other structures are the same as those of the third embodiment.

With the above-described structure, the same effects as those of the above-described first and third embodiments can be also obtained in the fourth embodiment.

Figure 14:
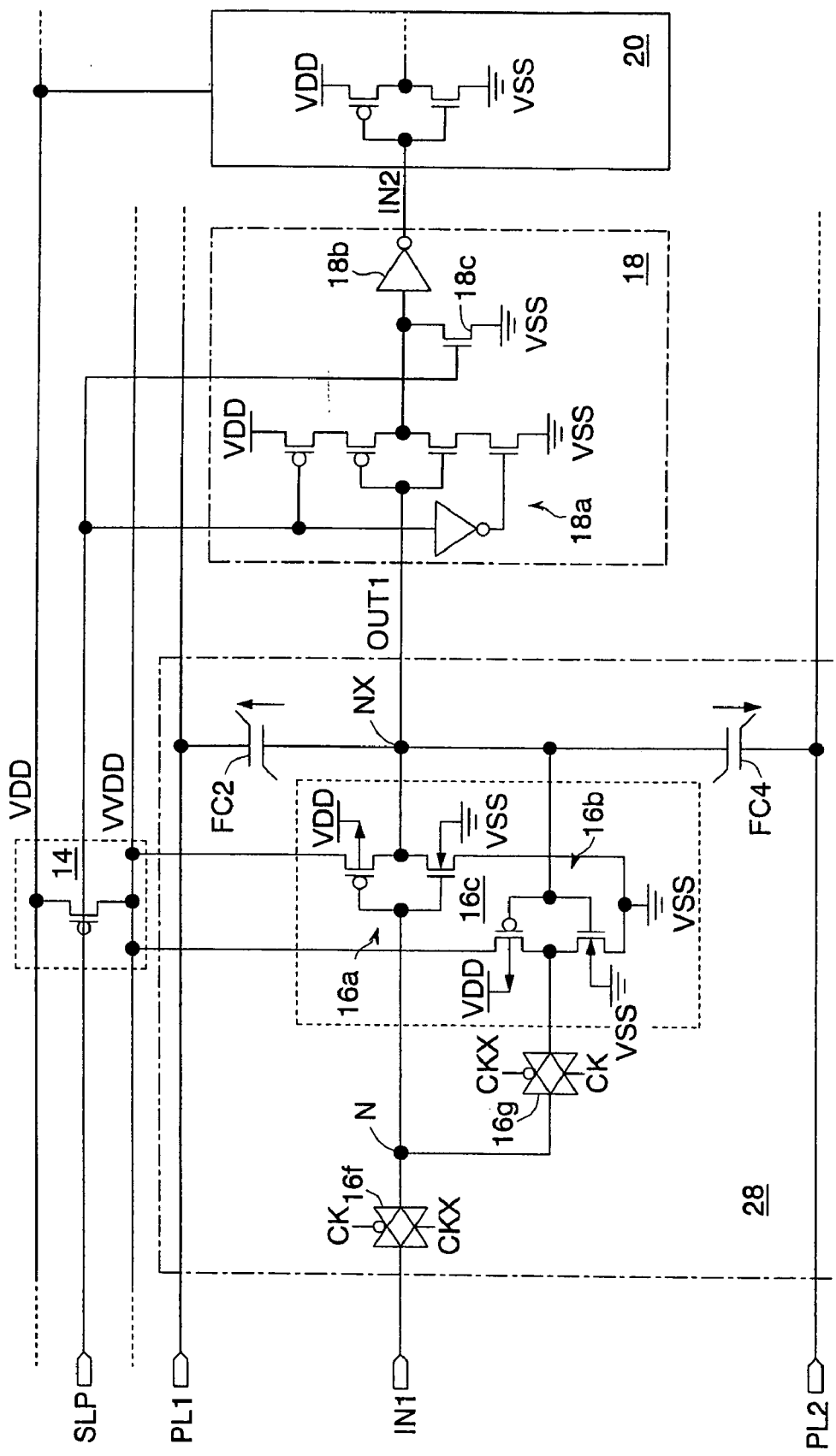
FIG. 14 is a circuit diagram showing an essential part of a fifth embodiment of the semiconductor integrated circuit of the present invention.

FIG. 14 shows an essential part of a fifth embodiment of the present invention. The same reference numerals and symbols are used to designate the same circuits and signals as those explained in the first and third embodiments, and detailed explanation thereof will be omitted.

In a semiconductor integrated circuit of this embodiment, a first circuit block (nonvolatile latch circuit) 28 is formed in place of the first circuit block 26 of the third embodiment. Other structures are the same as those of the first embodiment.

The nonvolatile latch circuit 28 is constituted of the first circuit block 26 of the third embodiment from which the ferroelectric capacitors FC1, FC3 connected to the node N are omitted. Therefore, the area of the nonvolatile latch circuit 28 is smaller than that in the third embodiment.

In this embodiment, in a store operation, a first and a second plate voltage signal PL1, PL2 change to a high level for predetermined periods respectively, and data held in a latch circuit 16c is written to ferroelectric capacitors FC2, FC4 connected to a node NX.

In a recall operation, the first plate voltage signal PL1 are changed to the high level for a predetermined period while the second plate line PL2 is grounded. A voltage of the node NX changes to a voltage according to residual dielectric polarization values of the ferroelectric capacitors FC2, FC4.

The latch circuit 16c is activated due to the change of the sleep signal SLP to a low level. A CMOS inverter 16b of the latch circuit 16c receives the voltage of the node NX at an input thereof to start operating. Then, the latch circuit 16c restores data held thereon before the store operation.

With the above-described structure, the same effects as those of the above-described first and third embodiments can be also obtained in the fifth embodiment. Moreover, in this embodiment, the area of the nonvolatile latch circuit 28 can be reduced.

Figure 15:
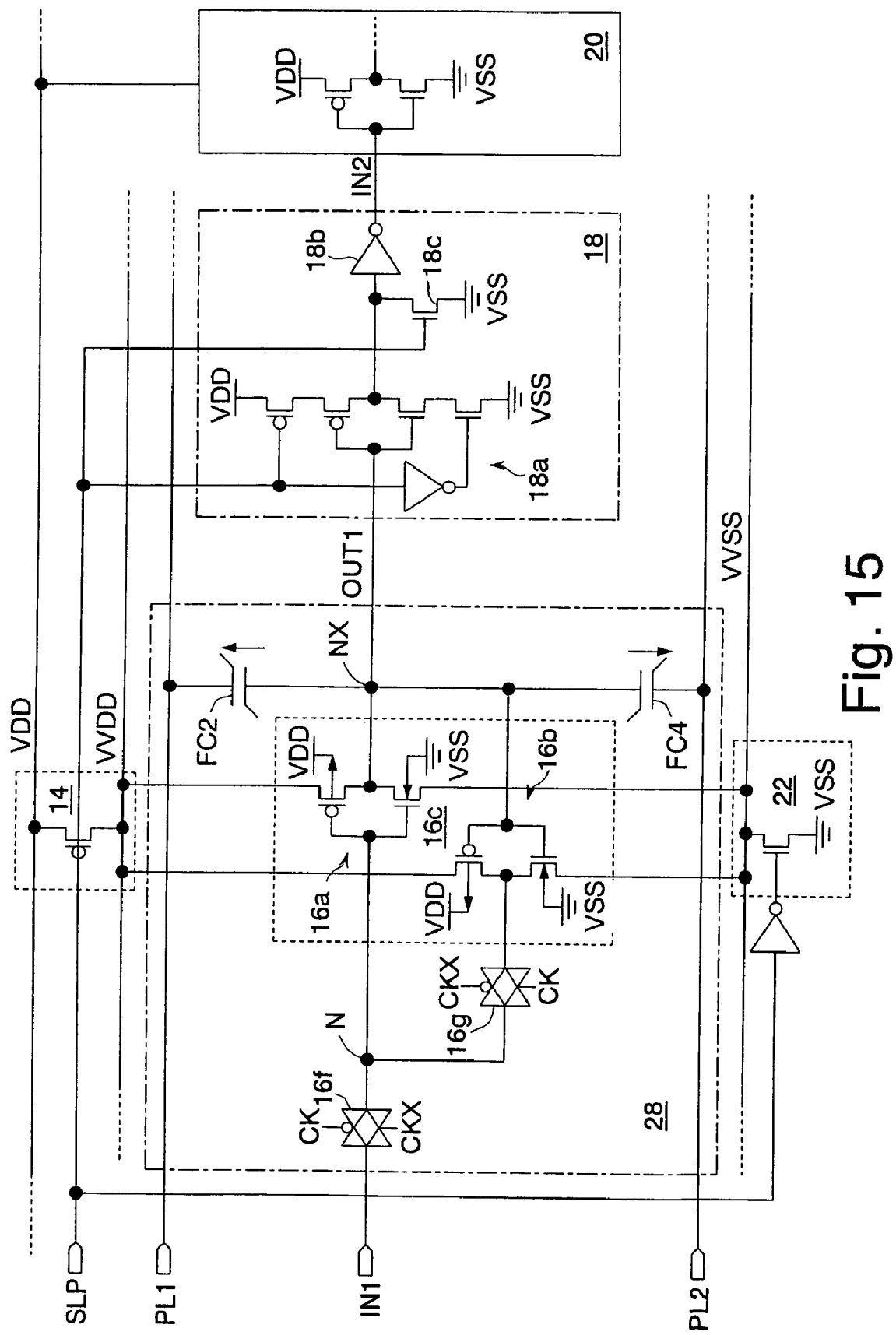
FIG. 15 is a circuit diagram showing an essential part of a sixth embodiment of the semiconductor integrated circuit of the present invention.

FIG. 15 shows an essential part of a sixth embodiment of the present invention. The same reference numerals and symbols are used to designate the same circuits and signals as those explained in the first to third embodiments, and detailed explanation thereof will be omitted.

In a semiconductor integrated circuit of this embodiment, a first circuit block (nonvolatile latch circuit) 28 is formed in place of the first circuit block 26 of the fourth embodiment. Other structures are the same as those in the first embodiment.

The same effects as those in the above-described first and third embodiments can be also obtained in this embodiment. Moreover, in this embodiment, the area of the nonvolatile latch circuit 28 can be reduced.

Figure 16:
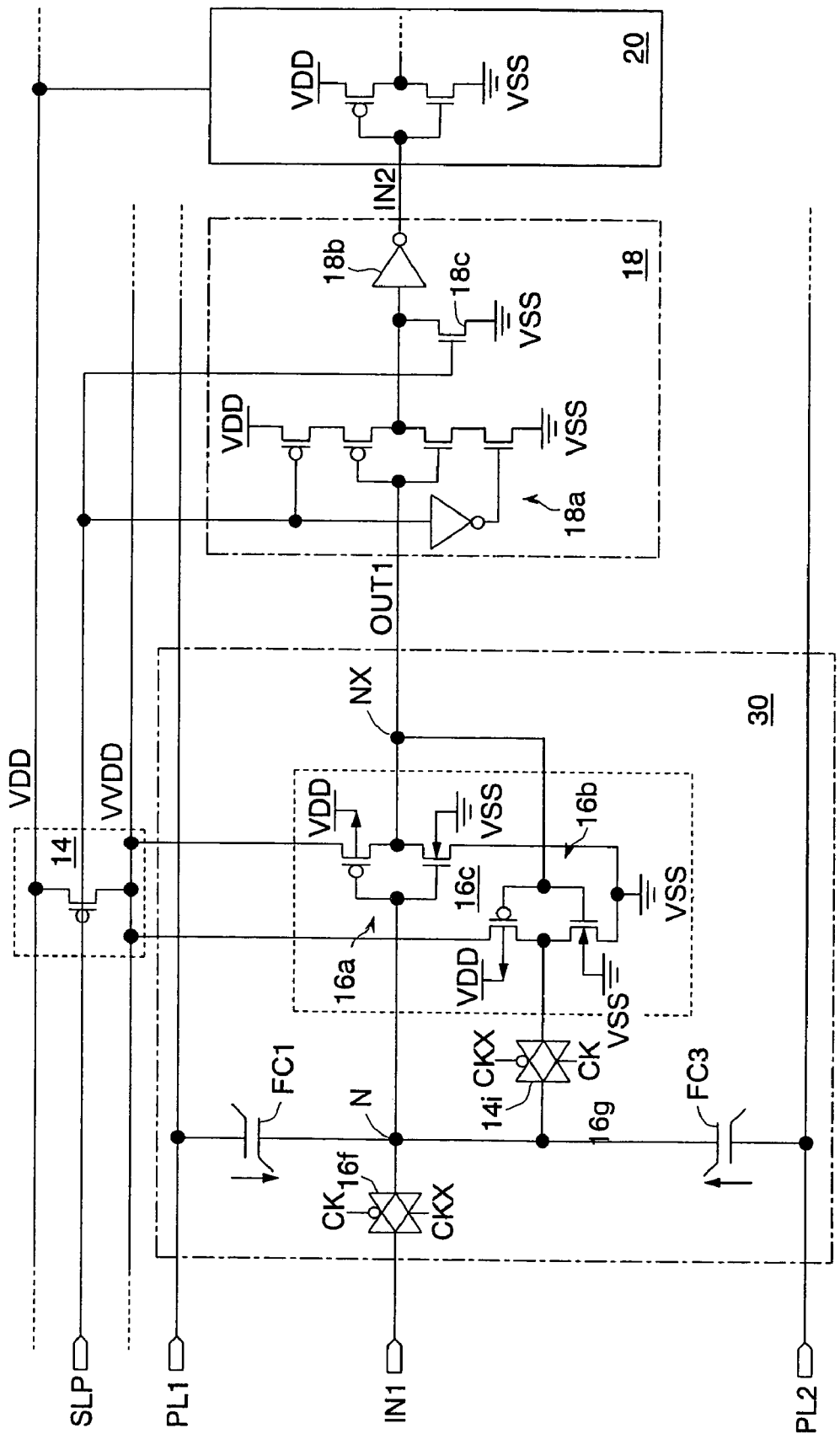
FIG. 16 is a circuit diagram showing an essential part of a seventh embodiment of the semiconductor integrated circuit of the present invention.

FIG. 16 shows an essential part of a seventh embodiment of the present invention. The same reference numerals and symbols are used to designate the same circuits and signals as those explained in the first to third embodiments, and detailed explanation thereof will be omitted.

In a semiconductor integrated circuit of this embodiment, a first circuit block (nonvolatile latch circuit) 30 is formed in place of the first circuit block 26 of the third embodiment. Other structures are the same as those in the third embodiment.

The nonvolatile latch circuit 30 is constituted of the first circuit block 26 of the third embodiment from which the ferroelectric capacitors FC2, FC4 connected to the node NX are omitted. Consequently, the area of the nonvolatile latch circuit 30 is smaller than that in the third embodiment.

The same effects as those of the above-described first, third, and fifth embodiments can be also obtained in this embodiment.

Figure 17:
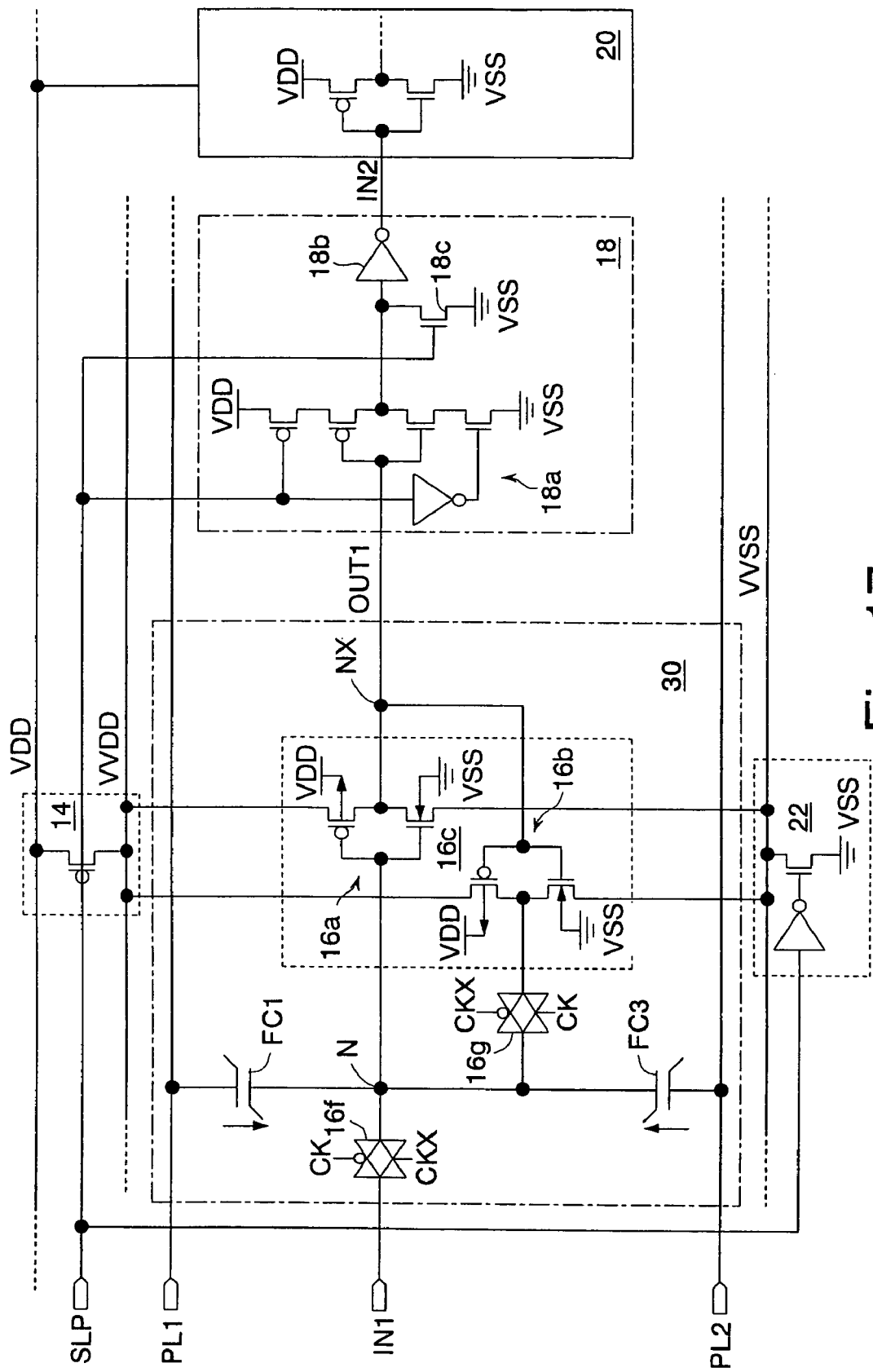
FIG. 17 is a circuit diagram showing an essential part of an eighth embodiment of the semiconductor integrated circuit of the present invention.

FIG. 17 shows an essential part of an eighth embodiment of the present invention. The same reference numerals and symbols are used to designate the same circuits and signals as those explained in the first to third embodiments, and detailed explanation thereof will be omitted.

In a semiconductor integrated circuit of this embodiment, a first circuit block (nonvolatile latch circuit) 30 is formed in place of the first circuit block 26 of the fourth embodiment. Other structures are the same as those in the fourth embodiment.

The same effects as those of the above-described first, third, and fifth embodiments can be also obtained in this embodiment.

Figure 18:
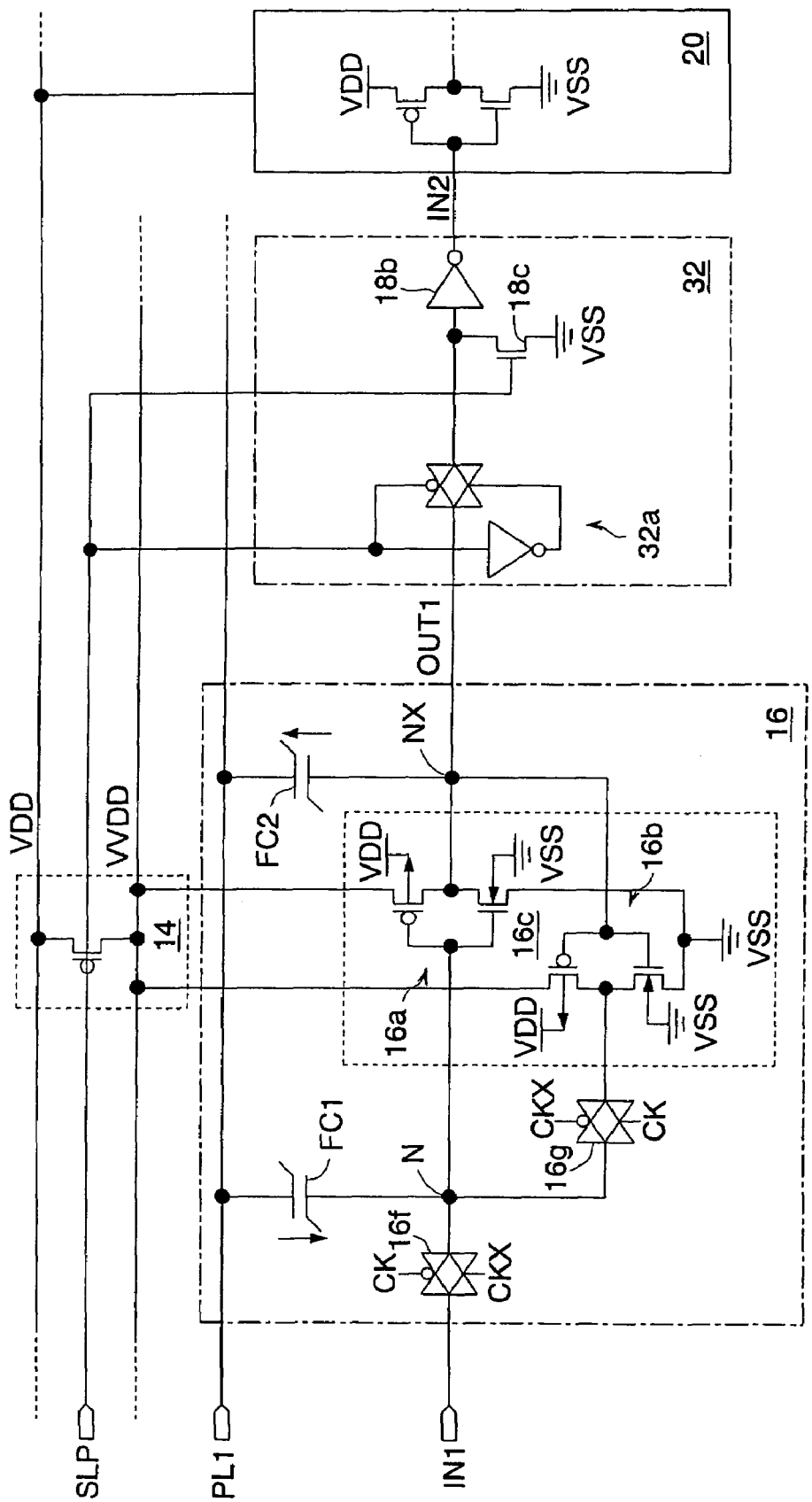
FIG. 18 is circuit diagram showing an essential part of a ninth embodiment of the semiconductor integrated circuit of the present invention.

FIG. 18 shows an essential part of a ninth embodiment of the present invention. The same reference numerals and symbols are used to designate the same circuits and signals as those explained in the first embodiment, and detailed explanation thereof will be omitted.

In a semiconductor integrated circuit of this embodiment, a floating prevention circuit 32 is formed in place of the floating prevention circuit 18 of the first embodiment. Other structures are the same as those in the fourth embodiment.

The floating prevention circuit 32 has a CMOS switch 32a in place of the clocked inverter 18a shown in FIG. 2. The CMOS switch 32a turns on in response to the activation (low level) of a sleep signal SLP (normal operation mode), and turns off in response to the inactivation (high level) of the sleep signal SLP (sleep mode).

The same effects as those in the above-described first embodiment can be also obtained in this embodiment.

Figure 19:
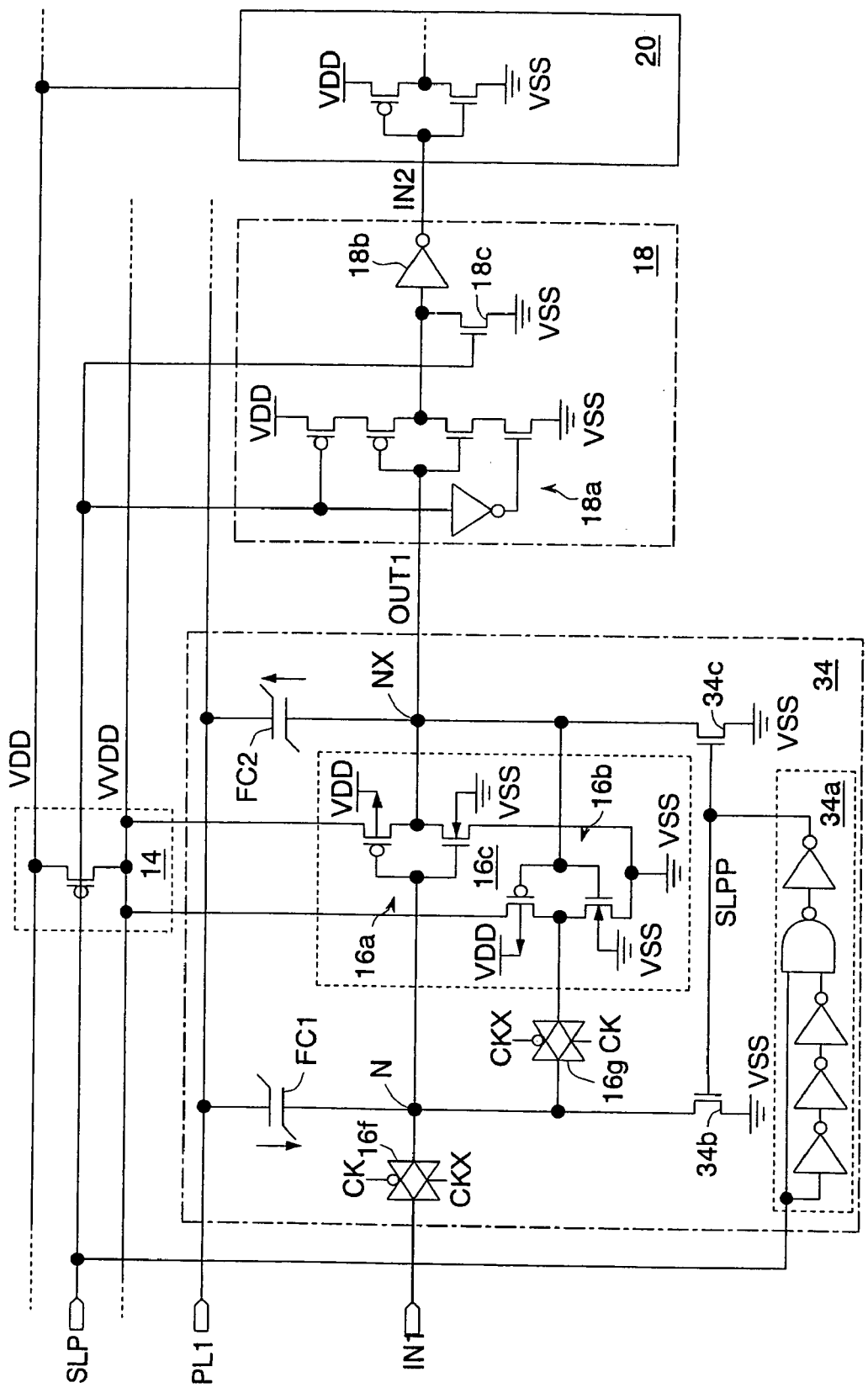
FIG. 19 is a circuit diagram showing an essential part of a tenth embodiment of the semiconductor integrated circuit of the present invention.

FIG. 19 shows an essential part of a tenth embodiment of the present invention. The same reference numerals and symbols are used to designate the same circuits and signals as those explained in the first embodiment, and detailed explanation thereof will be omitted.

In a semiconductor integrated circuit of this embodiment, a first circuit block (nonvolatile latch circuit) 34 is formed in place of the first circuit block 16 of the first embodiment. Other structures are the same as those in the first embodiment.

The nonvolatile latch circuit 34 is constituted of the nonvolatile latch circuit 16 shown in FIG. 2 to which a pulse generator 34a and nMOS transistors 34b, 34c are added. The pulse generator 34a generates a pulse signal SLPP in synchronization with a rising edge of the sleep signal SLP.

A source and a drain of the nMOS transistor 34b are connected to a node N and a ground line VSS respectively, and a gate thereof receives the pulse signal SLPP. A source and a drain of the nMOS transistor 34c are connected to the node NX and the ground line VSS respectively, and a gate thereof receives the pulse signal SLPP.

Figure 20:
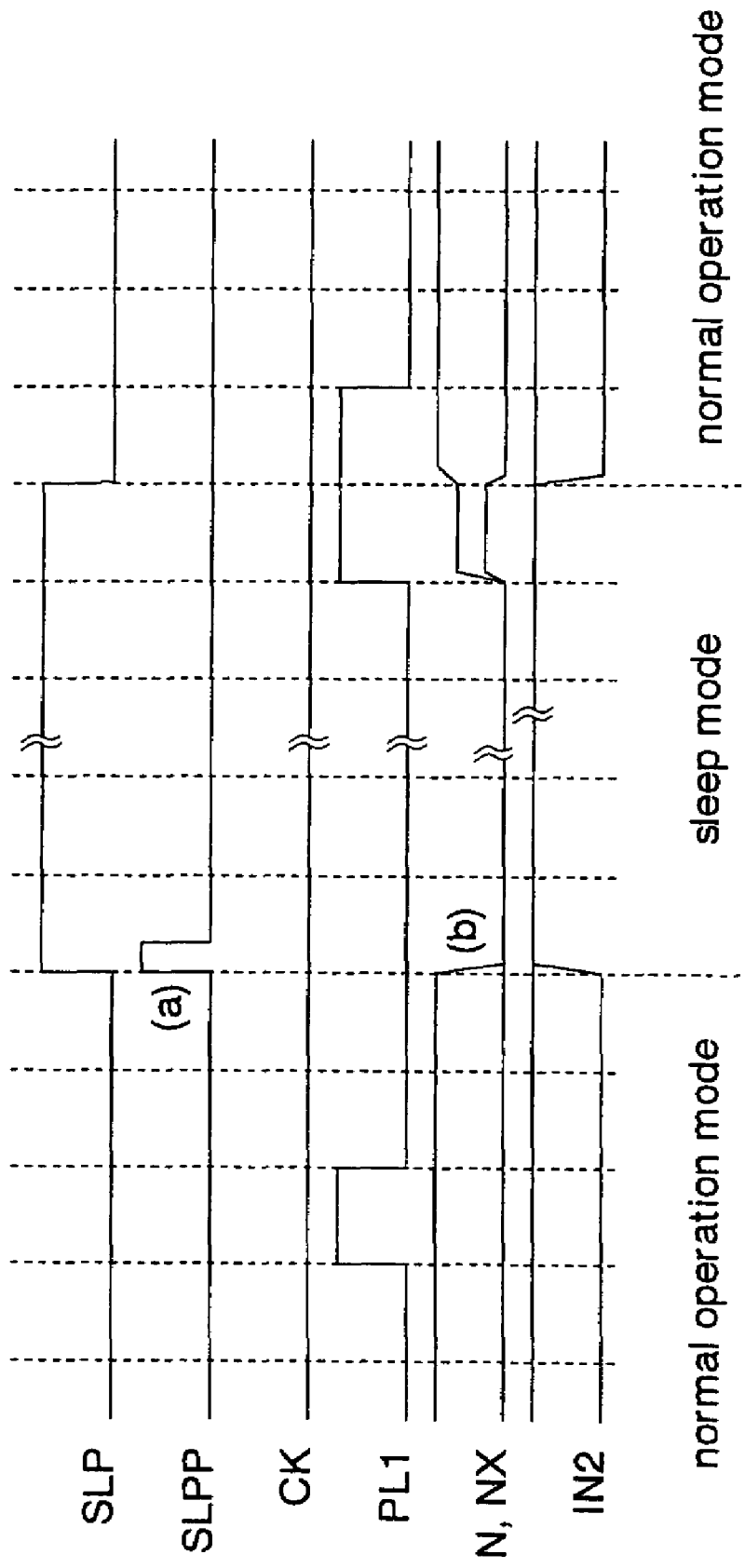
FIG. 20 is a timing chart showing the operation of the semiconductor integrated circuit of the tenth embodiment.

FIG. 20 shows the operation of the semiconductor integrated circuit of the tenth embodiment. Explanation on the same operations as those of the first embodiment (FIG. 4) will be omitted.

In this embodiment, the pulse signal SLPP is generated at the time of switching from a normal operation mode to a sleep mode (FIG. 20(a)). The nMOS transistors 34b, 34c turn on during a period in which the pulse signal SLPP is at a high level to connect the nodes N, NX to the ground line VSS. Consequently, voltages of the nodes N, NX change quickly to 0 V at the start of the sleep mode (FIG. 20(b)). In other words, a voltage difference between both ends of each of the ferroelectric capacitors FC1, FC2 quickly turns to 0 V at the start of the sleep mode. There exists no period in which the nodes N, NX are at an intermediate voltage, so that residual dielectric polarization values of the ferroelectric capacitors FC1, FC2 do not vary even when power supply noises and so on occur at the start of the sleep mode.

The same effects as those in the above-described first embodiment can be also obtained in this embodiment. Moreover, in this embodiment, the nodes N, NX are forcibly connected to the ground line at the start of the sleep mode, so that the variation in the residual dielectric polarization values of the ferroelectric capacitors FC1, FC2 due to noises is prevented.

Incidentally, the description in the above-described embodiments is on the examples where substrates of the pMOS transistor and the nMOS transistor constituting the CMOS inverters 16a, 16b are connected to the power supply line VDD and the ground line VSS respectively. The present invention is not limited to such an embodiment. For example, in a case where the structure of a diffusion layer of a semiconductor substrate is a structure not causing the occurrence of latch-up, the substrates of the pMOS transistor and the nMOS transistor constituting the CMOS inverters 16a, 16b may be connected to the virtual power supply line VVDD and the virtual ground line VVSS respectively.

Incidentally, in the above-described second to eighth embodiments, the examples where the floating prevention circuit 18 having the clocked inverter 18a is formed are explained. The present invention is not limited to such an embodiment. For example, the floating prevention circuit 32 having the CMOS switch 32a may be formed.

Incidentally, the description in the above-described tenth embodiment is made on the example where the pulse generator 34a and the nMOS transistors 34b, 34c are formed in the nonvolatile latch circuit 34 having the ferroelectric capacitors FC1, FC2. The present invention is not limited to such an embodiment. For example, the pulse generator 34a and the nMOS transistors 34b, 34c may be formed in the nonvolatile latch circuit 26 (third embodiment, FIG. 9) having the ferroelectric capacitors FC1, FC2, FC3, FC4. Alternatively, the pulse generator 34a and the nMOS transistors 34b, 34c may be formed in the nonvolatile latch circuit 28 of the fifth embodiment and the nonvolatile latch circuit 30 of the seventh embodiment.

The invention is not limited to the above embodiments and various modifications may be made without departing from the spirit and scope of the invention. Any improvement may be made in part or all of the components.

What is claimed is:

1. A semiconductor integrated circuit comprising:
   a normal power supply line to which a power supply voltage is constantly supplied;
   a virtual power supply line;
   a first switch that connects said normal power supply line and said virtual power supply line in response to activation of a switch control signal;
   a switch control circuit that maintains the activation of the switch control signal during a normal operation mode and inactivation of the switch control signal during a low power mode;
   a first circuit block connected to said virtual power supply line at its power supply terminal;
   a second circuit block connected to said normal power supply line at its power supply terminal; and
   a floating prevention circuit disposed between an output of said first circuit block and an input of said second circuit block, wherein
   said floating prevention circuit has a second switch that connects a connecting node to a first voltage line in response to the inactivation of the switch control signal, and interrupts the connection between the connecting node and the first voltage line in response to the activation of the switch control signal, said connecting node being between the output of said first circuit block and the input of said second circuit block.

2. The semiconductor integrated circuit according to claim 1, wherein
   said second switch is a transistor connected to the first voltage line at its source, connected to the connecting node at its drain, and receiving the switch control signal at its gate.

3. The semiconductor integrated circuit according to claim 1, further comprising
   a plate voltage generator for generating a first plate voltage signal on a first plate line when the normal operation mode is switched to the low power mode and when the low power mode is switched to the normal operation mode, wherein said first circuit block comprises:
   a latch circuit having therein two buffer circuits with their inputs and outputs connected to each other and their power supply terminals connected to said virtual power supply line; and
   a pair of ferroelectric capacitors connected to the inputs of said buffer circuits at one ends, respectively, and connected to said first plate line at the other ends.

4. The semiconductor integrated circuit according to claim 3, wherein
   when the normal operation mode is switched to the low power mode, said plate voltage generator changes the first plate voltage signal from a low level to a high level for a predetermined period before the inactivation of the switch control signal.

5. The semiconductor integrated circuit according to claim 3, wherein:
   when the low power mode is switched to the normal operation mode, said plate voltage generator changes the first plate voltage signal from a low level to a high level for a predetermined period; and
   said switch control circuit activates the switch control signal during a high level period of the first plate voltage signal.

6. The semiconductor integrated circuit according to claim 3, wherein
   said floating prevention circuit has a clocked inverter disposed between the output of said first circuit block and said connecting node, the clocked inverter being on during the activation of the switch control signal, and being off during the inactivation of the switch control signal.

7. The semiconductor integrated circuit according to claim 3, wherein
   said floating prevention circuit has a CMOS switch connected to the output of said first circuit block at one end and connected to said connecting node at the other end, the CMOS switch being on during the activation of the switch control signal and being off during the inactivation of the switch control signal.

8. The semiconductor integrated circuit according to claim 3, wherein
   said first circuit block has a third switch that connects the inputs of said buffer circuits to the first voltage line in response to the inactivation of the switch control signal.

9. The semiconductor integrated circuit according to claim 1, further comprising
   a plate voltage generator that generates a first plate voltage signal and a second plate voltage signal on a first plate line and a second plate line, respectively, when the normal operation mode is switched to the low power mode, and generates the first plate voltage signal on the first plate line when the low power mode is switched to the normal operation mode, wherein said first circuit block comprises:
   a latch circuit having therein two buffer circuits with their inputs and outputs connected to each other and their power supply terminals connected to said virtual power supply line;
   a pair of first ferroelectric capacitors connected in series between the first plate line and the second plate line and connected to the input of one of the buffer circuits at a connecting node of said first ferroelectric capacitors; and
   a pair of second ferroelectric capacitors connected in series between the first plate line and the second plate line and connected to the input of the other one of the buffer circuits at a connecting node of said second ferroelectric capacitors.

10. The semiconductor integrated circuit according to claim 9, wherein
    when the normal operation mode is switched to the low power mode, said plate voltage generator changes the first and second plate voltage signals from a low level to a high level for a predetermined period before the inactivation of the switch control signal.

11. The semiconductor integrated circuit according to claim 9, wherein:
when the low power mode is switched to the normal operation mode, said plate voltage generator changes the first plate voltage signal from a low level to a high level for a predetermined period while maintaining the low level of the second plate voltage signal; and
said switch control circuit activates the switch control signal during a high level period of the first plate voltage signal.

12. The semiconductor integrated circuit according to claim 9, wherein
said floating prevention circuit has a clocked inverter disposed between the output of said first circuit block and said connecting node, the clocked inverter being on during the activation of the switch control signal, and being off during the inactivation of the switch control signal.

13. The semiconductor integrated circuit according to claim 9, wherein
said floating prevention circuit has a CMOS switch connected to the output of said first circuit block at one end and connected to said connecting node at the other end, the CMOS switch being on during the activation of the switch control signal and being off during the inactivation of the switch control signal.

14. The semiconductor integrated circuit according to claim 9, wherein
said first circuit block has a third switch that connects the inputs of said buffer circuits to the first voltage line in response to the inactivation of the switch control signal.

15. The semiconductor integrated circuit according to claim 1, further comprising
a plate voltage generator that generates a first plate voltage signal and a second plate voltage signal on a first plate line and a second plate line, respectively, when the normal operation mode is switched to the low power mode, and generates the first plate voltage signal on the first plate line when the low power mode is switched to the normal operation mode, wherein said first circuit block comprises:
a latch circuit having therein two buffer circuits with their inputs and outputs connected to each other and their power supply terminals connected to said virtual power supply line; and
a pair of ferroelectric capacitors connected in series between the first plate line and the second plate line and connected to the input of one of the buffer circuits at a connecting node of said ferroelectric capacitors.

16. The semiconductor integrated circuit according to claim 1, wherein:
said first switch is made up of a transistor of a first conductive type; and
said second switch is made up of a transistor of a second conductive type that is reverse in polarity to the first conductive type.

17. The semiconductor integrated circuit according to claim 1, wherein:
said first switch is made up of a transistor of a first conductive type having a first threshold voltage;
said first circuit block includes a transistor of a first conductive type having a second threshold voltage whose absolute value is smaller than an absolute value of the first threshold voltage; and
said second circuit block includes a transistor of a first conductive type having a third threshold voltage whose absolute value is larger than the absolute value of the second threshold voltage.

* * * * *